(12) United States Patent
Lee

(10) Patent No.: US 9,905,535 B2
(45) Date of Patent: Feb. 27, 2018

(54) SEMICONDUCTOR PACKAGES AND FABRICATION METHOD THEREOF

(71) Applicant: In Lee, Hwaseong-si (KR)

(72) Inventor: In Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/883,592

(22) Filed: Oct. 14, 2015

(65) Prior Publication Data

US 2016/0148906 A1   May 26, 2016

(30) Foreign Application Priority Data

Nov. 21, 2014  (KR) ........................ 10-2014-0163399

(51) Int. Cl.
*H01L 23/48*  (2006.01)
*H01L 25/065*  (2006.01)

(52) U.S. Cl.
CPC .. *H01L 25/0657* (2013.01); *H01L 2224/0401* (2013.01); *H01L 2224/0557* (2013.01); *H01L 2224/06181* (2013.01); *H01L 2224/16145* (2013.01); *H01L 2224/16225* (2013.01); *H01L 2224/16227* (2013.01); *H01L 2224/17181* (2013.01); *H01L 2225/06513* (2013.01); *H01L 2225/06517* (2013.01); *H01L 2225/06544* (2013.01); *H01L 2225/06562* (2013.01); *H01L 2225/06565* (2013.01); *H01L 2924/0002* (2013.01); *H01L 2924/15174* (2013.01); *H01L 2924/15311* (2013.01); *H01L 2924/181* (2013.01)

(58) Field of Classification Search
CPC . H01L 2225/06562; H01L 2225/06544; H01L 2225/06555; H01L 25/0657
See application file for complete search history.

(56) References Cited

U.S. PATENT DOCUMENTS

| 8,174,126 | B2 | 5/2012 | Hwang et al. |
| 8,487,444 | B2 | 7/2013 | Law et al. |
| 8,592,252 | B2 | 11/2013 | Bathan et al. |
| 8,717,828 | B2 | 5/2014 | Kim et al. |
| 8,736,068 | B2 | 5/2014 | Bartley et al. |
| 2009/0003103 | A1* | 1/2009 | Shimizu ................ G11C 5/143 |
| | | | 365/201 |

(Continued)

FOREIGN PATENT DOCUMENTS

| JP | 2004335948 A | 11/2004 |
| KR | 20130035442 A | 4/2013 |

*Primary Examiner* — Syed Gheyas
(74) *Attorney, Agent, or Firm* — Renaissance IP Law Group LLP

(57) ABSTRACT

A semiconductor package and a method of fabricating the same are provided. The semiconductor package may include a first semiconductor chip with a first circuit pattern, a second semiconductor chip disposed on the first semiconductor chip and provided with a second circuit pattern, and first and second connection structures penetrating the first and second semiconductor chips. The first connection structure may be electrically connected to the first circuit pattern and may be electrically disconnected from the second circuit pattern. The second connection structure may be electrically disconnected from the first circuit pattern and may be electrically connected to the second circuit pattern.

15 Claims, 14 Drawing Sheets

(56) References Cited

U.S. PATENT DOCUMENTS

| | | | |
|---|---|---|---|
| 2010/0224977 A1* | 9/2010 | Kim | H01L 21/76898 257/686 |
| 2010/0225002 A1 | 9/2010 | Law et al. | |
| 2010/0308467 A1 | 12/2010 | Bathan et al. | |
| 2012/0007251 A1 | 1/2012 | Hwang et al. | |
| 2012/0133041 A1* | 5/2012 | Phee | H01L 21/76898 257/737 |
| 2012/0137040 A1 | 5/2012 | Kim et al. | |
| 2012/0187570 A1 | 7/2012 | Bartley et al. | |
| 2014/0145266 A1 | 5/2014 | Ishikawa | |
| 2014/0239493 A1 | 8/2014 | Abematsu et al. | |

* cited by examiner

SEMICONDUCTOR PACKAGES AND FABRICATION METHOD THEREOF

CROSS-REFERENCE TO RELATED APPLICATIONS

This U.S. non-provisional patent application claims priority under 35 U.S.C. § 119 to Korean Patent Application No. 10-2014-0163399, filed on Nov. 21, 2014, in the Korean Intellectual Property Office, the entire contents of which are hereby incorporated by reference.

BACKGROUND OF THE INVENTION

Example embodiments of the inventive concept relate to a semiconductor package with a plurality of semiconductor chips and a method of fabricating the same.

Semiconductor devices are widely used in high performance electronic systems, and the capacity and/or speed of semiconductor devices increases at a rapid pace. Thus, research is carried out in order to integrate multifunctional circuits into smaller semiconductor devices and to improve the performance of semiconductor devices.

Technologies of stacking semiconductor devices are developing to realize a semiconductor device with a high density and a high operation speed. For example, according to a multi-chip package technology, a plurality of chips are mounted on one semiconductor package, and according to a system-in package technology, heterogeneous chips are stacked to serve as a single system. Accordingly, there is an increasing demand for a semiconductor package with stacked semiconductor devices capable of being operated with a high speed and a method to make such a semiconductor package.

SUMMARY

Example embodiments of the inventive concept provide a semiconductor package including a plurality of semiconductor chips and having a fast operation speed.

A semiconductor package and a method of fabricating the same are disclosed in the present disclosure. According to one aspect of the inventive concept, a semiconductor package may include a substrate, a first semiconductor chip mounted on the substrate and provided with a first circuit pattern, a second semiconductor chip disposed on the first semiconductor chip and provided with a second circuit pattern, a first connection structure penetrating the first and second semiconductor chips, and a second connection structure disposed beside the first connection structure to penetrate the first and second semiconductor chips. The first connection structure may be electrically connected to the first circuit pattern and may be electrically disconnected from the second circuit pattern. The second connection structure may be electrically disconnected from the first circuit pattern and may be electrically connected to the second circuit pattern.

In exemplary embodiments, the first connection structure may include a first connection via provided through the first semiconductor chip and electrically connected to the first circuit pattern, a second dummy via provided through the second semiconductor chip and electrically disconnected from the second circuit pattern, and a first connection terminal provided between the first and second semiconductor chips and coupled to the first connection via and the second dummy via.

In exemplary embodiments, the second connection structure may include a first dummy via provided through the first semiconductor chip and electrically disconnected from the first circuit pattern, a second connection via provided through the second semiconductor chip electrically connected to the second circuit pattern, and a second connection terminal provided between the first and second semiconductor chips and coupled to the first dummy via and the second connection via.

In exemplary embodiments, the second semiconductor chip may be shifted from the first semiconductor chip, on the first semiconductor chip.

In exemplary embodiments, the semiconductor package may further include a third semiconductor chip mounted on the second semiconductor chip and provided with a third circuit pattern. The first connection structure may be electrically connected to the third circuit pattern, and the second connection structure may be electrically disconnected from the third circuit pattern.

In exemplary embodiments, the second circuit pattern may include an integrated circuit that is of the same kind as that of the first circuit pattern.

In exemplary embodiments, the first connection structure may include a plurality of first connection structures arranged to form at least one column, and the second connection structure may include a plurality of second connection structures arranged to form at least one column parallel or substantially parallel to the column of the first connection structures.

According to another aspect of the present disclosure, a semiconductor package may include a substrate, a first semiconductor chip mounted on the substrate and provided with a first connection via and a first dummy via, a second semiconductor chip mounted on the first semiconductor chip and provided with a second connection via and a second dummy via, a first connection terminal interposed between the first and second semiconductor chips and coupled to the first connection via and the second dummy via, and a second connection terminal interposed between the first and the second semiconductor chips and coupled to the first dummy via and the second connection via.

In exemplary embodiments, when viewed in a plan view, the second connection via may be overlapped with the first dummy via and the second dummy via may be overlapped with the first connection via.

In exemplary embodiments, the first semiconductor chip may include a first circuit pattern, and the first circuit pattern may be electrically connected to the first connection via and may be electrically disconnected from the first dummy via.

In exemplary embodiments, the second semiconductor chip may include a second circuit pattern, and the second circuit pattern may be electrically connected to the second connection via and may be electrically disconnected from the second dummy via.

In exemplary embodiments, the first connection via may include a plurality of first connection vias, and the first dummy via may include a plurality of first dummy vias. The number of the first connection vias may be the same as that of the first dummy vias.

In exemplary embodiments, the second connection via may include a plurality of second connection vias, and the second dummy via may include a plurality of second dummy vias. The number of the second connection vias may be the same as that of the second dummy vias.

In exemplarily embodiments, the first connection via may include a first signal transmitting connection via, a first ground connection via, and a first voltage supplying connection via, and the second dummy via may include a first signal transmitting dummy via, a first ground dummy via, and a first voltage supplying dummy via.

In exemplarily embodiments, the second signal transmitting connection via may be connected to the first signal transmitting dummy via, and the second signal transmitting dummy via may be connected to the first signal transmitting connection via.

In exemplary embodiments, the second semiconductor chip may be laterally shifted from the first semiconductor chip, on the first semiconductor chip.

According to yet another aspect of the present disclosure, a method of fabricating a semiconductor package may include mounting a first semiconductor chip, in which a first circuit pattern, a first connection via, and a first dummy via are provided, on a substrate and mounting a second semiconductor chip, in which a second connection via and a second dummy via are provided, on the first semiconductor chip. The mounting of the second semiconductor chip may include electrically connecting the second connection via to the first dummy via and electrically connecting the second dummy via to the first connection via.

In exemplarily embodiments, the method may further include providing a semiconductor wafer including semiconductor chips of the same kind, sawing the semiconductor wafer to separate the semiconductor chips from each other, providing one of the semiconductor chips as the first semiconductor chip, and providing another of the semiconductor chips as the second semiconductor chip.

In exemplarily embodiments, the mounting of the second semiconductor chip may further include rotating the second semiconductor chip by 180 degrees and disposing the rotated second semiconductor chip on the first semiconductor chip.

In exemplarily embodiments, the mounting of the second semiconductor chip comprises forming a first connection terminal between the first and second semiconductor chips and forming a second connection terminal between the first and second semiconductor chips. The first connection terminal may be coupled to the first connection via and the second dummy via, and the second connection terminal may be coupled to the first dummy via and the second connection via. Further, the first connection terminal may be electrically disconnected from the first dummy via and the second connection via, and the second connection terminal may be electrically disconnected from the first connection via and the second dummy via.

In exemplarily embodiments, the mounting of the second semiconductor chip may include disposing the second connection via to be overlapped with the first dummy via, when viewed in a plan view, and disposing the second dummy via to be overlapped with the first connection via.

According to another aspect, a semiconductor package may comprise a substrate; a plurality of semiconductor chips stacked to each other and mounted on the substrate, each of the plurality of semiconductor chips may be provided with a circuit pattern, a connection via electrically connected to the circuit pattern and a dummy via electrically disconnected from the circuit pattern; a first connection structure electrically connecting one of the connection via and the dummy via provided in each of the plurality of semiconductor chips and a second connection structure electrically connecting another one of the connection via and the dummy via provided in each of the plurality of semiconductor chips.

In exemplarily embodiments, the plurality of semiconductor chips may include a first, second, third and fourth semiconductor chips. The first connection structure may electrically connect a first connection via provided in the first semiconductor chip, a second connection via provided in the second semiconductor chip, a third dummy via provided in the third semiconductor chip, and a fourth dummy via provided in the fourth semiconductor chip. The second connection structure may electrically connect a first dummy via provided in the first semiconductor chip, a second dummy via provided in the second semiconductor chip, a third connection via provided in the third semiconductor chip, and a fourth connection via provided in the fourth semiconductor chip.

In exemplarily embodiments, the plurality of semiconductor chips may include a first, second, third and fourth semiconductor chips. The first connection structure may electrically connect a first connection via provided in the first semiconductor chip, a second dummy via provided in the second semiconductor chip, a third connection via provided in the third semiconductor chip, and a fourth dummy via provided in the fourth semiconductor chip; and the second connection structure may electrically connect a first dummy via provided in the first semiconductor chip, a second connection via provided in the second semiconductor chip, a third dummy via provided in the third semiconductor chip, and a fourth connection via provided in the fourth semiconductor chip.

According to another aspect, a semiconductor package may comprises a substrate; a first semiconductor chip mounted on the substrate and provided with a first circuit pattern, a first connection via electrically connected to the first circuit pattern and a first dummy via electrically disconnected from the first circuit pattern; a second semiconductor chip disposed on the first semiconductor chip and provided with a second circuit pattern, a second connection via electrically connected to the second circuit pattern and a second dummy via electrically disconnected from the second circuit pattern; a third semiconductor chip mounted on the second semiconductor chip and provided with a third circuit pattern, a third connection via electrically connected to the third circuit pattern and a third dummy via electrically disconnected from the third circuit pattern; a fourth semiconductor chip mounted on the third semiconductor chip and provided with a fourth circuit pattern, a fourth connection via electrically connected to the fourth circuit pattern and a fourth dummy via electrically disconnected from the fourth circuit pattern; a first connection structure electrically connected to the first circuit pattern and the second circuit pattern, and a second connection structure electrically connected to the third circuit pattern and the four circuit pattern, The first connection structure may comprise the first connection via, the second connection via, the third dummy via, and the fourth dummy via which are vertically overlapped and electrically connected with each other. The second connection structure may comprise the first dummy via, the second dummy via, the third connection via, and the fourth connection via which are vertically overlapped and electrically connected with each other.

According to another aspect, a semiconductor package may comprises a substrate; a first semiconductor chip mounted on the substrate and provided with a first circuit pattern, a first connection via electrically connected to the first circuit pattern and a first dummy via electrically disconnected from the first circuit pattern; a second semiconductor chip disposed on the first semiconductor chip and provided with a second circuit pattern, a second connection via electrically connected to the second circuit pattern and a second dummy via electrically disconnected from the second circuit pattern; a third semiconductor chip mounted on the second semiconductor chip and provided with a third circuit pattern, a third connection via electrically connected to the third circuit pattern and a third dummy via electrically disconnected from the third circuit pattern; a fourth semiconductor chip mounted on the third semiconductor chip and provided with a fourth circuit pattern, a fourth connection via electrically connected to the fourth circuit pattern and a fourth dummy via electrically disconnected from the fourth circuit pattern; a first connection structure electrically connected the first circuit pattern and the third circuit pattern; and a second connection structure electrically connected the second circuit pattern and the fourth circuit pattern. The first connection structure may comprise the first connection via, the second dummy via, the third connection via, and the fourth dummy via which are vertically overlapped and electrically connected with each other. The second connection structure may comprise the first dummy via, the second connection via, the third dummy via, and the fourth connection via which are vertically overlapped and electrically connected with each other.

According to another aspect, a semiconductor package may comprises a substrate; a first semiconductor chip mounted on the substrate and provided with a first circuit pattern, a first connection via electrically connected to the first circuit pattern and three dummy via electrically disconnected from the first circuit pattern; a second semiconductor chip disposed on the first semiconductor chip and provided with a second circuit pattern, a second connection via electrically connected to the second circuit pattern and three dummy vias electrically disconnected from the second circuit pattern; a third semiconductor chip mounted on the second semiconductor chip and provided with a third circuit pattern, a third connection via electrically connected to the third circuit pattern and three dummy vias electrically disconnected from the third circuit pattern; a fourth semiconductor chip mounted on the third semiconductor chip and provided with a fourth circuit pattern, a fourth connection via electrically connected to the fourth circuit pattern and three dummy vias electrically disconnected from the fourth circuit pattern; a first connection structure electrically connected to the first circuit, wherein the first connection structure comprises the first connection via, one of three dummy vias provided in the second semiconductor chip, one of three dummy vias provided in the third semiconductor chip, and one of three dummy vias provided in the fourth semiconductor chip which are vertically overlapped and electrically connected with each other; a second connection structure electrically connected to the second circuit, wherein the second connection structure comprises one of three dummy vias provided in the first semiconductor chip, the second connection via, one of three dummy vias provided in the third semiconductor chip, and one of three dummy vias provided in the fourth semiconductor chip which are vertically overlapped and electrically connected with each other; a third connection structure electrically connected to the third circuit, wherein the third connection structure comprises one of three dummy vias provided in the first semiconductor chip, one of three dummy vias provided in the second semiconductor chip, the third connection via, and one of three dummy vias provided in the fourth semiconductor chip which are vertically overlapped and electrically connected with each other; and a fourth connection structure electrically connected to the fourth circuit, wherein the fourth connection structure comprises one of three dummy vias provided in the first semiconductor chip, one of three dummy vias provided in the second semiconductor chip, one of three dummy vias provided in the third semiconductor chip, and the fourth connection via which are vertically overlapped and electrically connected with each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
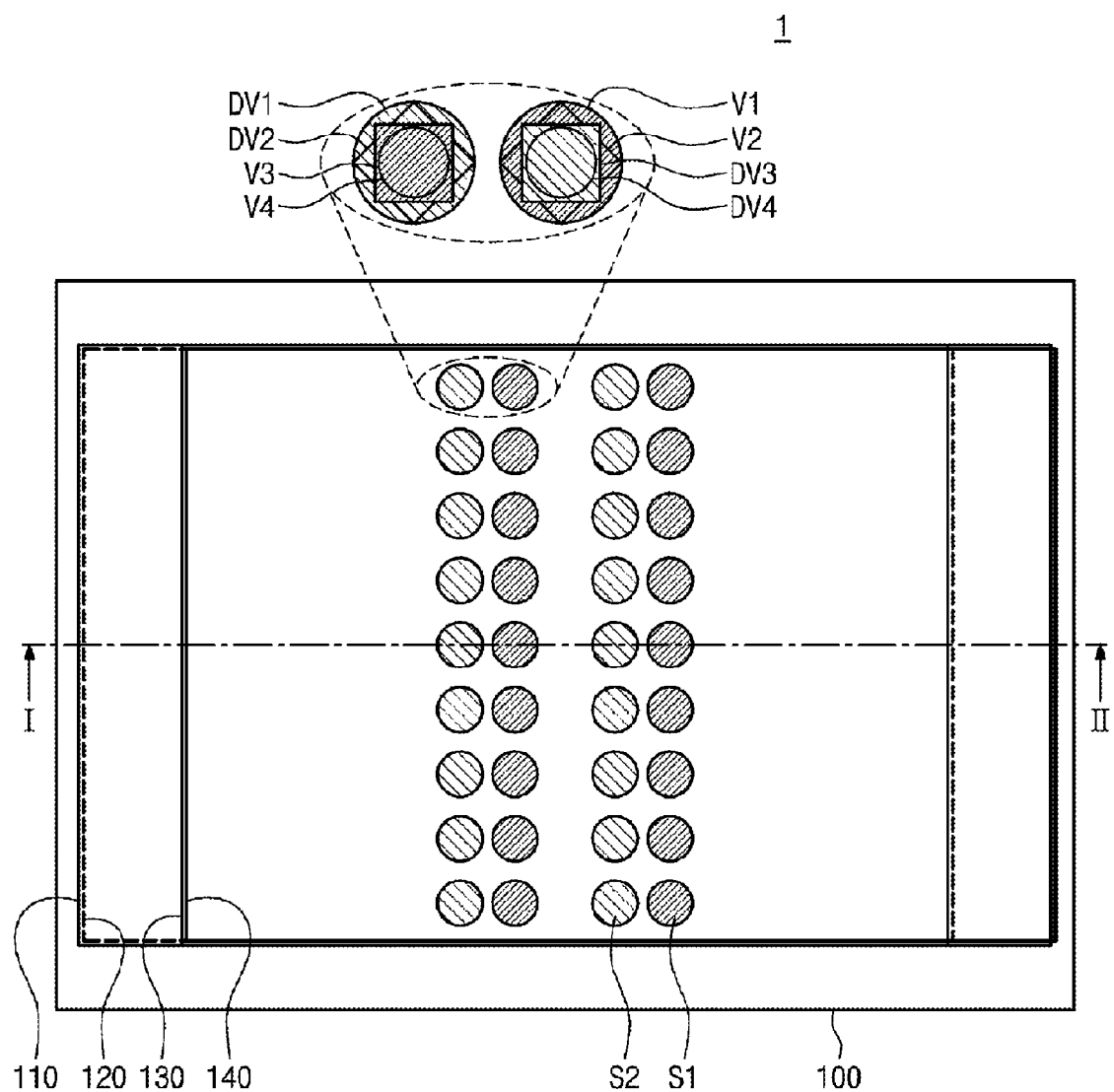
FIG. 1A is a plan view illustrating a semiconductor package according to exemplary embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
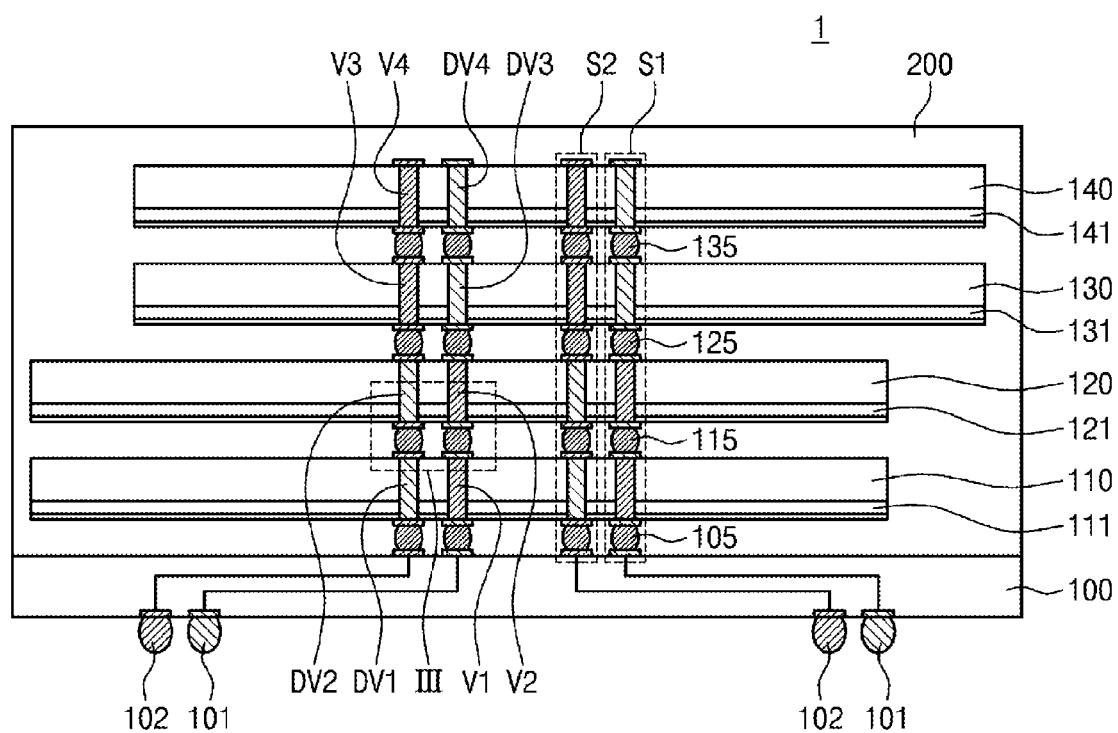
FIG. 1B is a sectional view taken along line I-II of FIG. 1A.
Figure 1C:
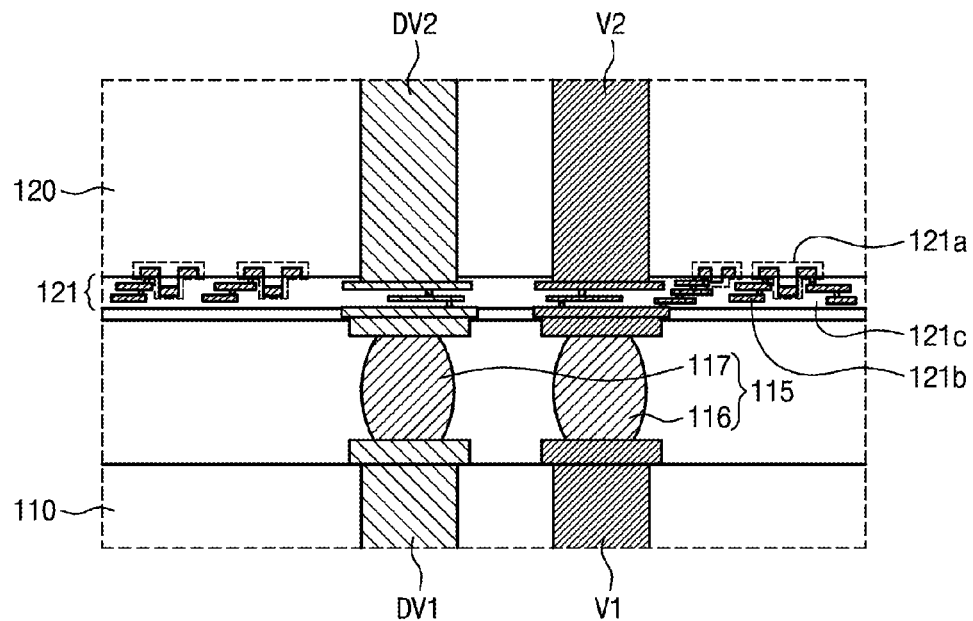
FIG. 1C is an enlarged sectional view of a region III of FIG. 1B.

FIG. 1A is a plan view illustrating a semiconductor package according to exemplary embodiments of the inventive concept. FIG. 1B is a sectional view taken along line I-II of FIG. 1A, and FIG. 1C is an enlarged sectional view of a region III of FIG. 1B.

Referring to FIGS. 1A and 1B, a semiconductor package 1 may include a substrate 100, e.g., a package substrate, a plurality of semiconductor chips 110, 120, 130, and 140 stacked on the substrate 100, and a plurality of connection structures S1 and S2. The first to fourth semiconductor chips 110, 120, 130, and 140 may be configured to have substantially the same structure and perform substantially the same function. For example, the first to fourth semiconductor chips 110, 120, 130, and 140 may be of the same kind, but example embodiments of the inventive concepts may not be limited thereto.

The substrate 100 may be a printed circuit board with a circuit pattern. First and second outer terminals 101 and 102 may be provided on a bottom surface of the substrate 100. The first and second outer terminals 101 and 102 may include a conductive material and may be provided in the form of a conductive ball such as a solder ball. The substrate 100 may be electrically connected to an external device (not shown) via the first and second outer terminals 101 and 102.

The first semiconductor chip 110 may be mounted on the substrate 100 in a flip-chip manner. The first semiconductor chip 110 may be electrically connected to the substrate 100 via first connecting portions 105. The first connecting portions 105 may be interposed between the substrate 100 and the first semiconductor chip 110. The first connecting portions 105 may include a conductive material (e.g., at least one of metals).

Referring to FIG. 1B, the first semiconductor chip 110 may include a first circuit pattern 111, first connection vias V1, and first dummy vias DV1. The first circuit pattern 111 may be disposed adjacent to the bottom surface of the first semiconductor chip 110. The first circuit pattern 111 may include integrated circuits (e.g., a memory circuit, a logic circuit, and/or any combination thereof). The first connection vias V1 may penetrate the first semiconductor chip 110 and may be electrically connected to the integrated circuits in the first circuit pattern 111. The first dummy vias DV1 may be provided to penetrate the first semiconductor chip 110 and may not be electrically connected to the integrated circuits in the first circuit pattern 111. Hereinafter, in the present specification, an expression of "a pattern is electrically connected to a circuit pattern and/or a semiconductor chip" is used to represent that the pattern is electrically connected to integrated circuits constituting the circuit pattern and/or the semiconductor chip. Also hereinafter in the present specification, the term "connection via" will be used to represent a via that is formed to penetrate a semiconductor chip therewith and is electrically connected to the integrated circuits of the circuit pattern of the semiconductor chip, whereas the term "dummy via" will be used to represent another via that is formed to penetrate a semiconductor chip therewith is electrically disconnected from the integrated circuits of the circuit pattern of the semiconductor chip. The first dummy vias DV1 may be provided beside and/or adjacent to the first connection vias V1 and may be electrically disconnected from the first connection vias V1. The first connection vias V1 and the first dummy vias DV1 may include a conductive material (e.g., at least one of metals). As an example, as shown in FIG. 1A, the total number of the first connection vias V1 may be the same as that of the first dummy vias DV1.

The second semiconductor chip 120 may be mounted on a top surface of the first semiconductor chip 110. Second connecting portions 115 may be provided between the first semiconductor chip 110 and the second semiconductor chip 120 and may be electrically connected to the first semiconductor chip 110 and the second semiconductor chip 120. The second semiconductor chip 120 may be overlapped with the first semiconductor chip 110, in the same area as that of the first semiconductor chip 110 in plan view. For example, the second semiconductor chip 120 may be vertically aligned with the first semiconductor chip 110, as shown in FIG. 1B.

The second semiconductor chip 120 may include a second circuit pattern 121, second connection vias V2, and second dummy vias DV2. The second circuit pattern 121 may be adjacent to a bottom surface of the second semiconductor chip 120. Referring to FIG. 1C, the second circuit pattern 121 may include integrated circuits 121a, interconnection lines 121b, and an insulating layer 121c. The integrated circuits 121a and the interconnection lines 121b may be provided in the insulating layer 121c. The integrated circuits 121a may include a memory circuit and/or a logic circuit. The second circuit pattern 121 may include integrated circuits, which are of the same kind as the first circuit pattern 111.

The second connection vias V2 may penetrate the second semiconductor chip 120. The second connection vias V2 may be electrically connected to the integrated circuits 121a in the second circuit pattern 121 via the interconnection lines 121b. The second dummy vias DV2 may penetrate the second semiconductor chip 120 and may be electrically disconnected from the integrated circuits 121a in the second circuit pattern 121. The second dummy vias DV2 may be disposed beside the second connection vias V2 and may be electrically disconnected from the second connection vias V2.

The second connecting portions 115 may include a first connection terminal 116 and a second connection terminal 117. The structure of the first and second connection terminals 116 and 117 may not be limited to that shown in FIG. 1C, and in some embodiments, the semiconductor package 1 may be configured to include a plurality of first and second connection terminals 116 and 117. The first connection terminal 116 may be coupled to the first and second connection vias V1 and V2. The second connection terminal 117 may be coupled to the first and second dummy vias DV1 and DV2. The second connection vias V2 may be electrically connected to the first connection vias V1 via the first connection terminal 116, and the second dummy vias DV2 may be electrically connected to the first dummy vias DV1 via the second connection terminal 117.

Referring back to FIG. 1B, the third semiconductor chip 130 may be mounted on the top surface of the second semiconductor chip 120. Third connecting portions 125 may be provided between the second semiconductor chip 120 and the third semiconductor chip 130 and may be coupled to the second semiconductor chip 120 and the third semiconductor chip 130. The third semiconductor chip 130 may include a third circuit pattern 131, third connection vias V3, and third dummy vias DV3. As an example, the third circuit pattern 131 may include integrated circuits, which are of the same kind as those of the first and second circuit patterns 111 and 121, but example embodiments of the present disclosure may not be limited thereto.

In some embodiments, the third semiconductor chip 130 may be laterally shifted from the second semiconductor chip 120. In other words, the third semiconductor chip 130 may be disposed offset from the second semiconductor chip 120 in a direction in which the third connection vias V3 is aligned with the third dummy vias DV3.

The fourth semiconductor chip 140 may be mounted on a top surface of the third semiconductor chip 130. In some embodiments, the fourth semiconductor chip 140 may be laterally shifted from the first and second semiconductor chips 110 and 120 in the same direction as the third semiconductor chip is shifted. When viewed in plan view, the fourth semiconductor chip 140 may be overlapped with and aligned to the third semiconductor chip 130. Fourth connecting portions 135 may be provided between the third semiconductor chip 130 and the fourth semiconductor chip 140 and may be coupled to the third semiconductor chip 130 and the fourth semiconductor chip 140.

The fourth semiconductor chip 140 may include a fourth circuit pattern 141, fourth connection vias V4, and fourth dummy vias DV4. The fourth circuit pattern 141 may include integrated circuits. The fourth dummy vias DV4 may be disposed beside the fourth connection vias V4 and may be electrically disconnected from the fourth connection vias V4. The fourth connection vias V4 and the fourth dummy vias DV4 may be formed of or include a conductive material (e.g., one of the metals).

As shown in FIG. 1A, a plurality of the first to fourth connection vias V1, V2, V3, and V4 and the first to fourth dummy vias DV1, DV2, DV3, and DV4 may be arranged to form a plurality of columns. Each column may include a plurality of connection vias or dummy vias arranged parallel to a specific direction, for example, parallel or substantially parallel to one side of the semiconductor chips for example. The number of the columns of the first to fourth connection vias V1, V2, V3, and V4 may be the same as that of the columns of the first to fourth dummy vias DV1, DV2, DV3, and DV4. In example embodiments, the total number of the first connection vias V1, the total number of the first dummy vias DV1, the total number of the second connection vias V2, the total number of the second dummy vias DV2, the total number of the third connection vias V3, the total number of the third dummy vias DV3, the total number of the fourth connection vias V4, and the total number of the fourth dummy vias DV4 may be the same.

The first to fourth semiconductor chips 110, 120, 130, and 140 may have the same area in plan view. When viewed in plan view, the third semiconductor chip 130 may be disposed to have a 2-fold rotational symmetry with respect to the second semiconductor chip 120. For example, when the third semiconductor chip 130 is rotated by an angle of 180 degrees (i.e., 360 degrees/2), the third semiconductor chip 130 may be configured in such a way that the third connection vias V3 thereof are overlapped with the second connection vias V2 and the third dummy vias DV3 thereof are overlapped with the second dummy vias DV2. The fourth semiconductor chip 140 may also be disposed to have a 2-fold rotational symmetry with respect to the second semiconductor chip 120.

Hereinafter, an electric connection structure of the semiconductor package 1 will be described.

On the substrate 100, a first connection structure S1 and a second connection structure S2 may be provided through the semiconductor chips and may be electrically connected to the substrate 100. The semiconductor package 1 may include a plurality of first connection structures S1 and a plurality of second connection structures S2. The second connection structures S2 may be disposed beside the first connection structure S1. As shown in FIG. 1A, the first connection structures S1 and the second connection structures S2 may be arranged to form at least one column of structures S1 and one column of structures S2. The column of the second connection structures S2 may be parallel or substantially parallel to that of the first connection structures S1. Although the first connection structures S1 are illustrated to form a plurality of columns, the first connection structures S1 may be arranged to form a single column. Hereinafter, a pair of the first and second connection structures S1 and S2 will be exemplarily described to reduce complexity in the drawings and to provide better understanding of example embodiments of the inventive concept.

Figure 4A:
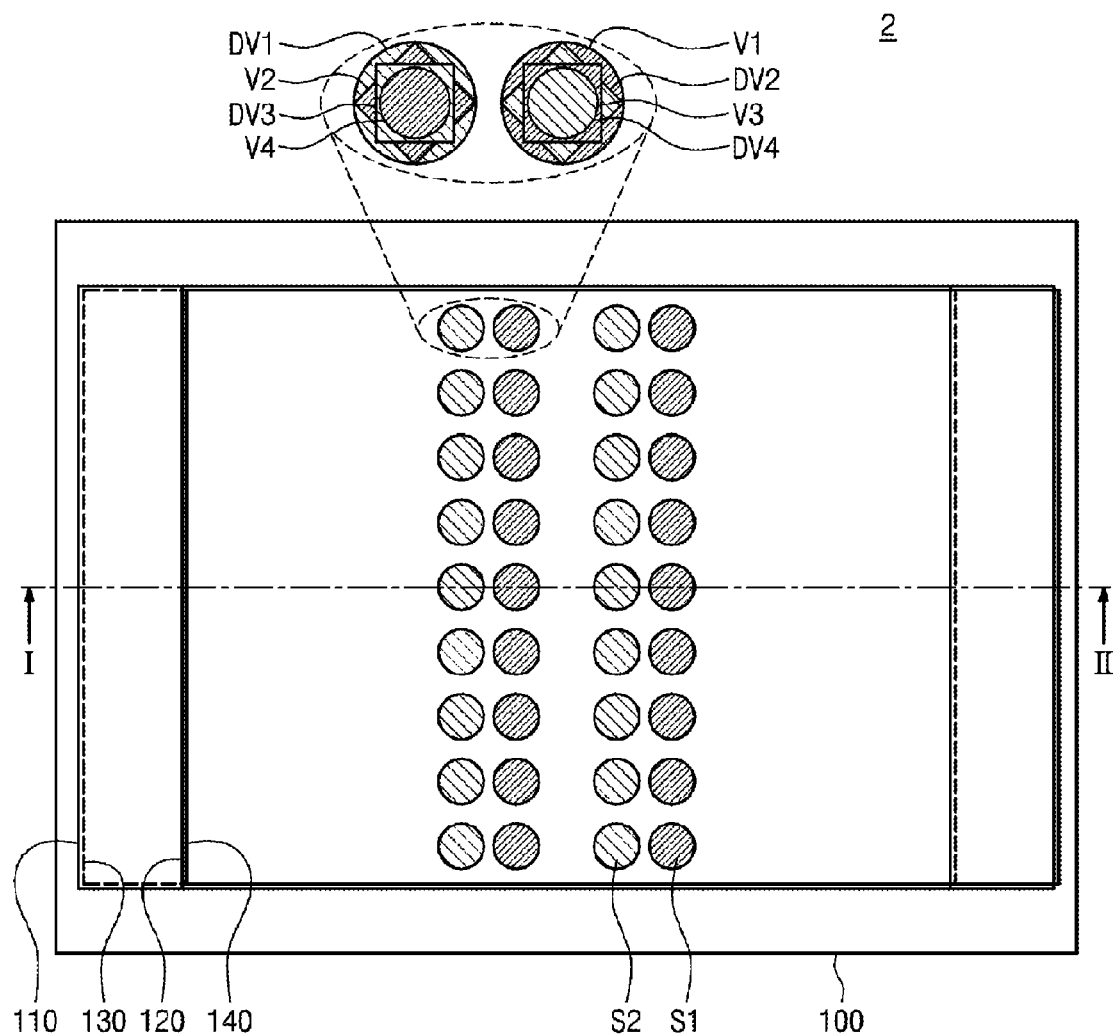
FIG. 4A is a plan view illustrating a semiconductor package according to other exemplary embodiments of the inventive concept.
Figure 5A:
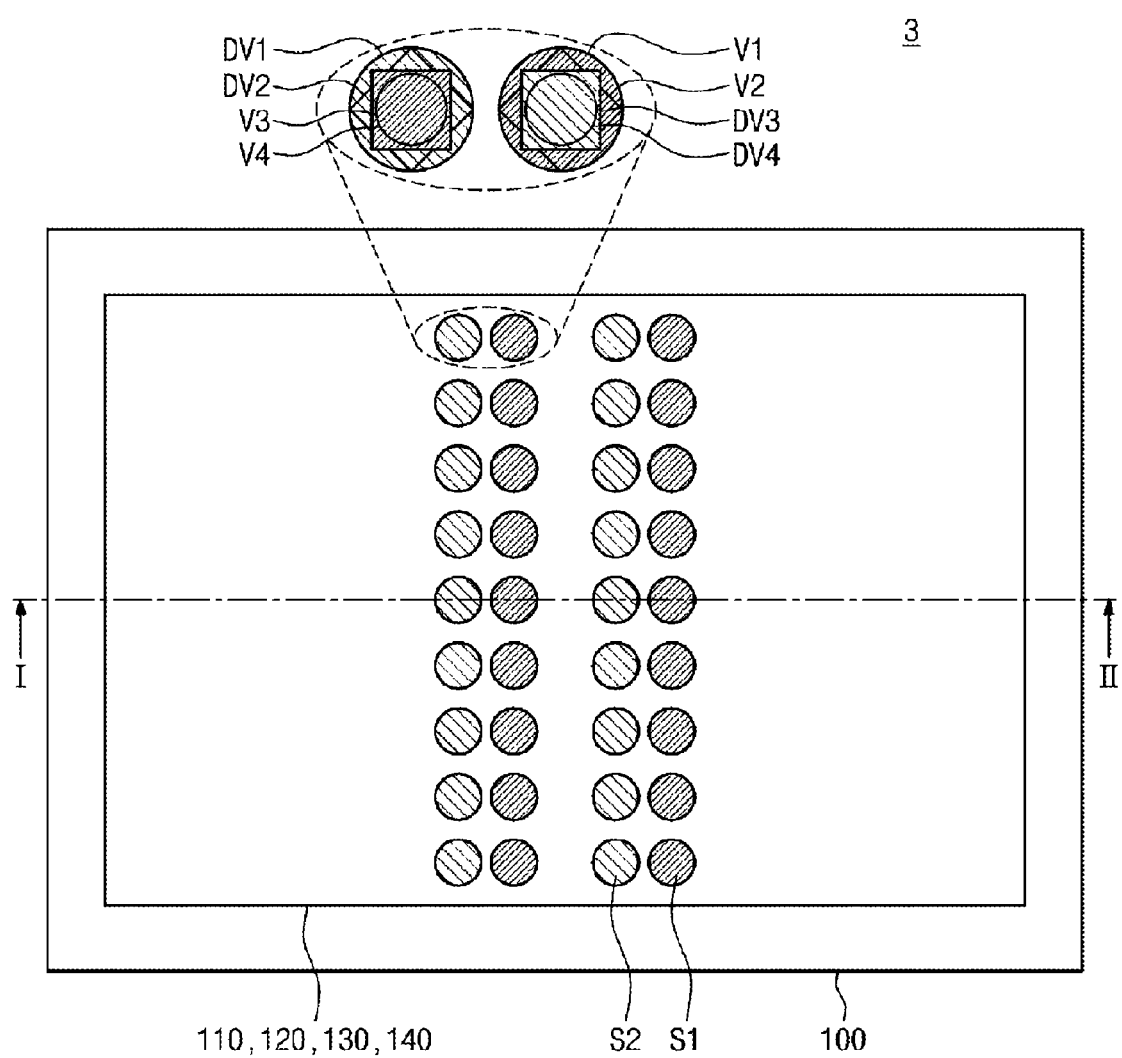
FIG. 5A is a plan view illustrating a semiconductor package according to still other exemplary embodiments of the inventive concept.

The first connection structure S1 may include the first connection vias V1, the second connection vias V2, the third dummy vias DV3, and the fourth dummy vias DV4, which are electrically connected to each other. Although FIGS. 1A, 4A, and 5A illustrate the vias V1, V2, V3, V4, DV1, DV2, DV3, and DV4 having different shapes and sizes, this difference is exaggerated to clearly distinguish types of the vias. In other words, the shapes and sizes of the vias V1, V2, V3, V4, DV1, DV2, DV3, and DV4 may not be limited to those illustrated and may be variously changed. For example, the vias V1, V2, V3, V4, DV1, DV2, DV3, and DV4 may be configured to have the same shape and the same size. As shown in FIG. 1A, the first connection vias V1, the second connection vias V2, the third dummy vias DV3, and the fourth dummy vias DV4 may be overlapped with each other. As shown in FIG. 1B, the first connection vias V1, the second connection vias V2, the third dummy vias DV3, and the fourth dummy vias DV4 may be electrically connected to each other through the second to fourth connecting portions 115, 125, and 135. The first connection structure S1 may include the first and second connection vias V1 and V2 and may be electrically connected to the first circuit pattern 111 and the second circuit pattern 121. The first connection structure S1 may include the third dummy vias DV3 and the fourth dummy vias DV4 and may be electrically disconnected from the third circuit pattern 131 and the fourth circuit pattern 141. The first connection structure S1 may be electrically connected to the first outer terminal 101 of the substrate 100. Electrical signals or voltages input through first outer terminal 101 may be transmitted to the integrated circuits of the first and second semiconductor chips 110 and 120 through the first connection structure S1. The first connection structure S1 may be used to operate the first and second semiconductor chips 110 and 120. As another example, the third dummy vias DV3 and the fourth dummy vias DV4 may be omitted.

The second connection structure S2 may include the first dummy vias DV1, the second dummy vias DV2, the third connection vias V3, and the fourth connection vias V4, which are electrically connected to each other. As shown in FIG. 1A, when viewed in plan view, the first dummy vias DV1, the second dummy vias DV2, the third connection vias V3, and the fourth connection vias V4 may be overlapped with each other. The second connection structure S2 may be electrically disconnected from the first connection structure S1. The second connection structure S2 may include the first and second dummy vias DV1 and DV2 and may be electrically disconnected from the first circuit pattern 111 and the second circuit pattern 121. The second connection structure S2 may include the third and fourth connection vias V3 and V4 and may be electrically connected to the third circuit pattern 131 and the fourth circuit pattern 141. The second connection structure S2 may be electrically connected to the second outer terminal 102 via the substrate 100. Electrical signals or voltages input through the second outer terminal 102 may be transmitted to the third and fourth integrated circuits 131 and 141 through the second connection structure S2. Here, the first and second dummy vias DV1 and DV2 may serve as a part of the connection pathways between the second outer terminal 102 and the third and fourth connection vias V3 and V4. The second connection structure S2 may be used to operate the third and fourth semiconductor chips 130 and 140.

The first and second connection structures S1 and S2 may include the dummy vias DV1, DV2, DV3, and DV4, and this makes it easy to operate the first to fourth semiconductor chips 110, 120, 130, and 140 in an independent or individual manner. Further, even if the circuit patterns 111, 121, 131, and 141 of the semiconductor chips 110, 120, 130, and 140 have the same structure, the first and second connection structures S1 and S2 may allow the semiconductor chips 110, 120, 130, and 140 to be operated in various manners.

In some embodiments, the first and second connection structures S1 and S2 may make it possible to operate the semiconductor chips 110, 120, 130, and 140, which are different from each other. The usage of the first and second connection structures S1 and S2 may make it possible to realize multiple signal pathways or channels for operating the semiconductor chips 110, 120, 130, and 140, and thus, the semiconductor chips 110, 120, 130, and 140 can be operated with an increased operation speed.

The first and second connection structures S1 and S2 may be used to transmit or receive electrical signals to or from the semiconductor chips 110, 120, 130, and 140. In this case, the electric connection between the first and second semiconductor chips 110 and 120 may be configured to have the same structure as that shown in FIG. 1C. The electric connections between the substrate 100 and the first semiconductor chip 110 and between the second to fourth semiconductor chips 120, 130, and 140 may also be configured to have a similar structure to that shown in FIG. 1C. Electrical signals transmitted to the first connection structure S1 may not be delivered to the second connection structure S2.

The first connection structure S1 may be used to provide signals or voltages to the first and second semiconductor chips 110 and 120 or to apply a ground voltage to the first and second semiconductor chips 110 and 120. The second connection structure S2 may be used to provide signals or voltages to the third and fourth semiconductor chips 130 and 140 or to apply a ground voltage to the third and fourth semiconductor chips 130 and 140. As an example, a voltage provided through the first connection structure S1 may not be delivered to the second connection structure S2. Here, the electric connections between the semiconductor chips 110, 120, 130, and 140 may be configured to have the same or similar structure to that shown in FIG. 1C. As another example, a voltage provided through the first connection structure S1 may be transmitted to the second connection structure S2. As another example, a voltage provided through the first connection structure S1 may be transmitted to the second connection structure S2, as shown in FIGS. 1D through 1F.

Figure 1D:
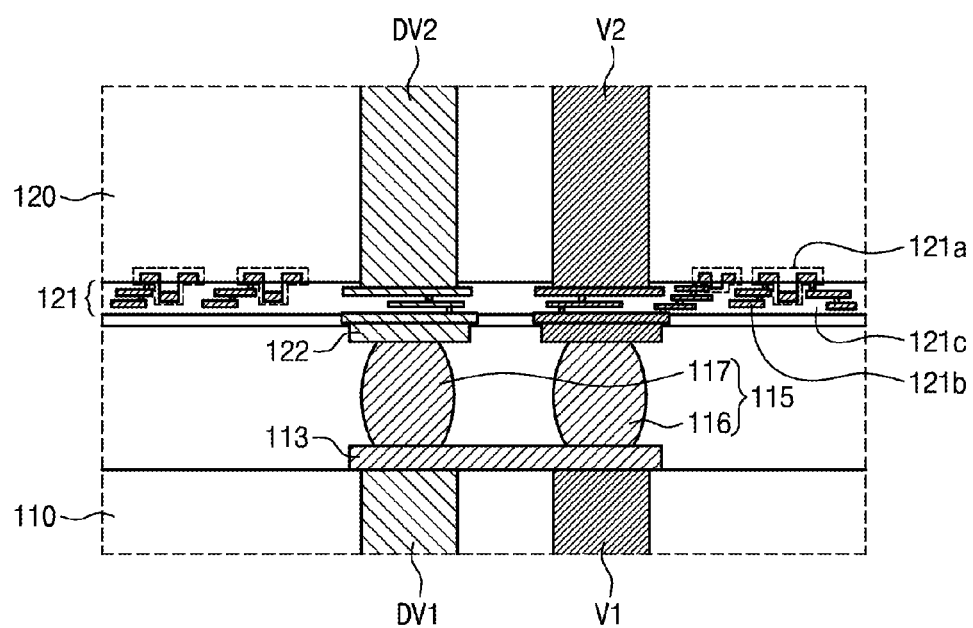
FIGS. 1D through 1F are sectional views corresponding to a region III of FIG. 1B to illustrate a supply of voltage in semiconductor chips according to other exemplary embodiments of the inventive concept.
Figure 1E:
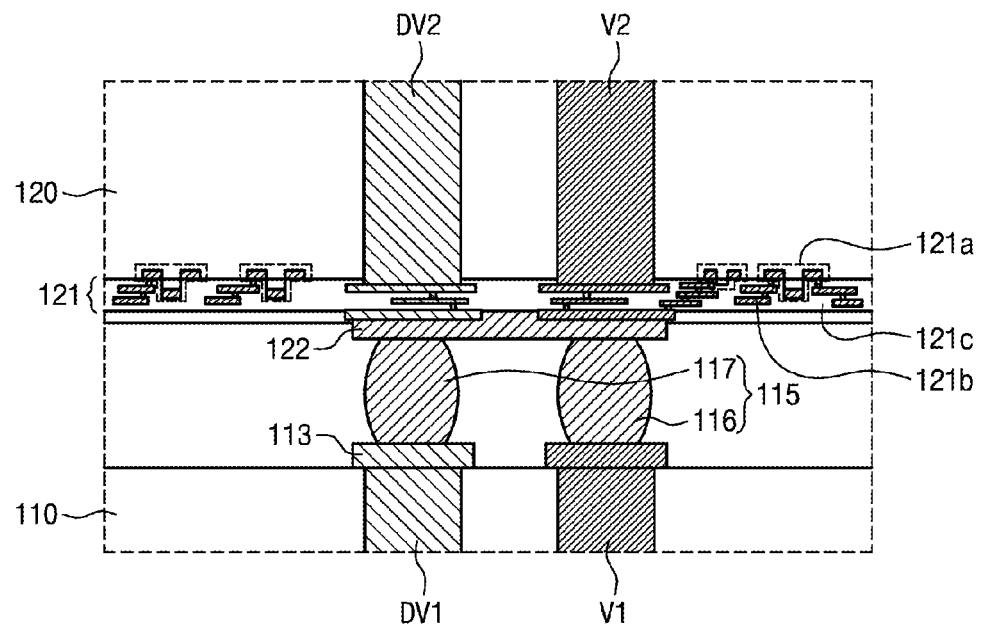
Figure 1F:
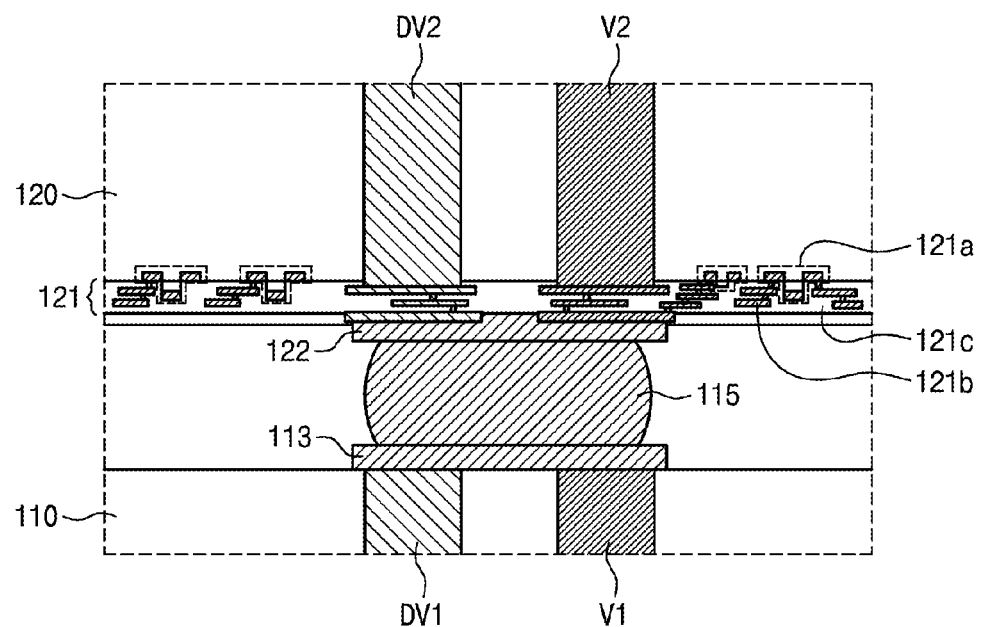

FIGS. 1D through 1F illustrate a supply of voltage in semiconductor chips according to other exemplary embodiments of the inventive concept, and each of them is a sectional view corresponding to a region III of FIG. 1B. Hereinafter, for concise description, a previously described element may be identified by a similar or identical reference number without repeating an overlapping description thereof.

Referring to FIGS. 1D through 1F, redistribution pads 113 may be provided on the top surface of the first semiconductor chip 110. The redistribution pads 113 may be interposed between the first connection vias V1 and the second connecting portions 115 and between the first dummy vias DV1 and the second connecting portions 115. Pads 122 may be provided on the bottom surface of the second semiconductor chip 120. The pads 122 may be respectively interposed between the second connection vias V2 and the second connecting portions 115 and between the second dummy vias DV2 and the second connecting portions 115. The redistribution pads 113 and pads 122 may be formed of or include a conductive material.

As an example, as shown in FIG. 1D, the redistribution pads 113 may be provided on the top surface of the first semiconductor chip 110. At least one of the redistribution pads 113 may be in contact with one of the first connection vias V1 and one of the first dummy vias DV1. Accordingly, the second connection structure S2 may be physically and electrically connected to the first connection structure S1. As another example, as shown in FIG. 1E, at least one of the pads 122 may be in contact with one of the second connection vias V2 and one of the second dummy vias DV2, and thus, the second connection structure S2 may be physically and electrically connected to the first connection structure S1. As another example, as shown in FIG. 1F, at least one of the redistribution pads 113 may be in contact with one of the first connection vias V1 and one of the first dummy vias DV1. At least one of the pads 122 may be in contact with one of the second connection vias V2 and one of the second dummy vias DV2. At least one of the second connecting portions 115 may be in contact with at least one of the redistribution pads 113 and at least one of the pads 122. The second connection structure S2 may be connected to the first connection structure S1.

Referring back to FIGS. 1A and 1B, a mold layer 200 may be provided on the substrate 100 to cover the first to fourth semiconductor chips 110, 120, 130, and 140. The mold layer 200 may be extended between the substrate 100 and the first semiconductor chip 110 and between the second to fourth semiconductor chips 120, 130, and 140. The mold layer 200 may include an under-fill material or an epoxy molding compound (EMC).

Hereinafter, a method of fabricating a semiconductor package, according to example embodiments of the inventive concept, will be described.

Figure 2A:
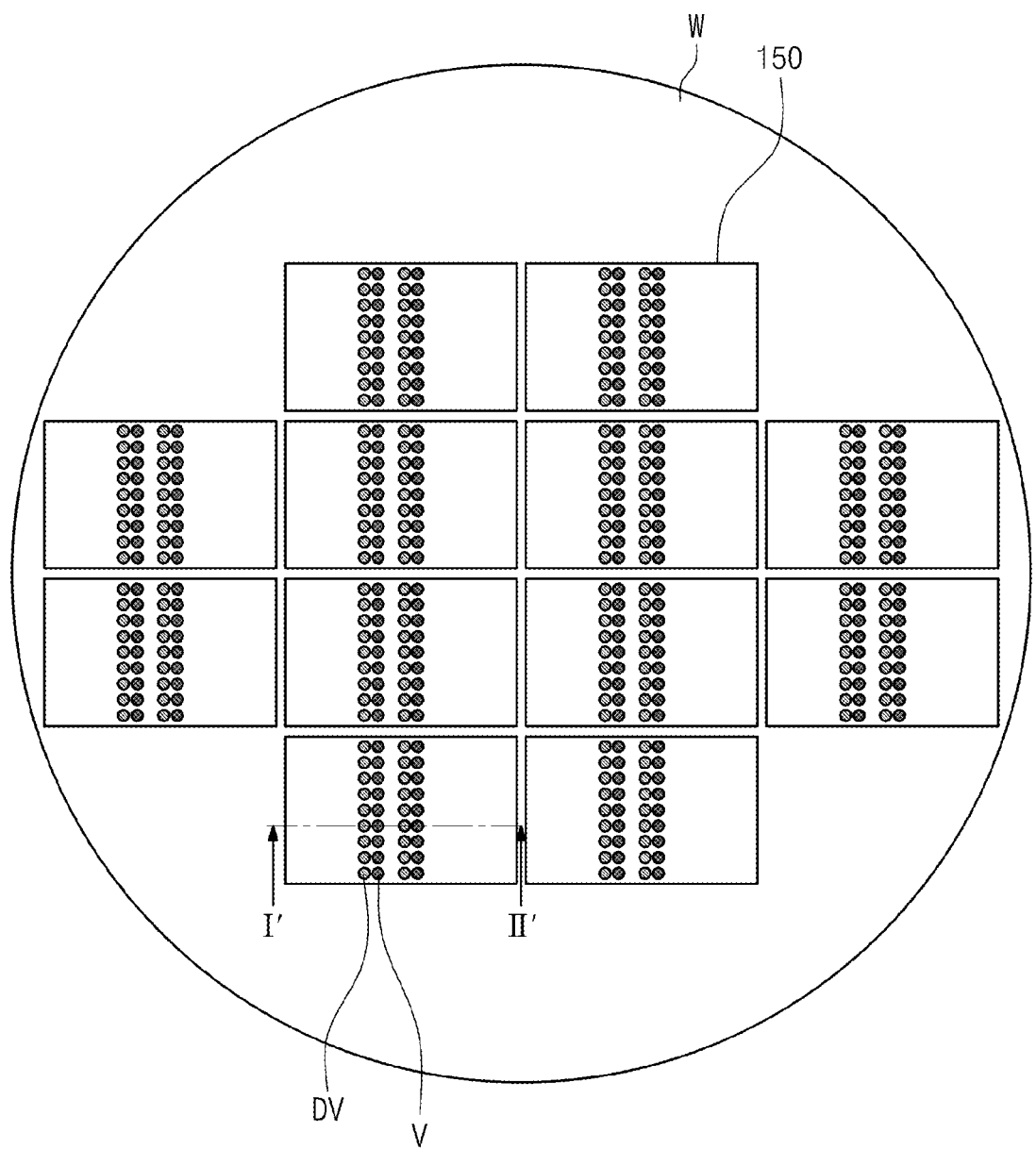
FIGS. 2A and 3 are a plan view and a sectional view illustrating a process of fabricating a semiconductor package, according to exemplary embodiments of the inventive concept.
Figure 2B:
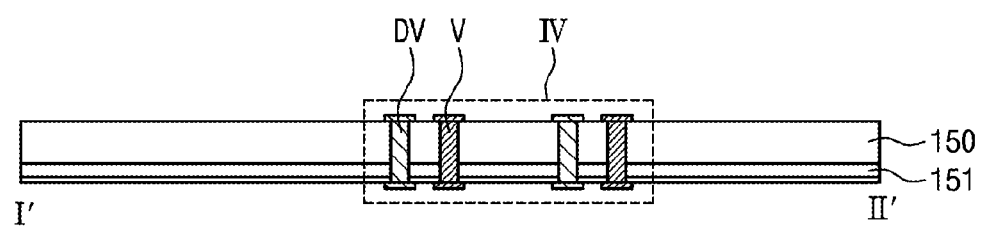
FIG. 2B is a sectional view taken along line I-II of FIG. 2A.
Figure 2C:
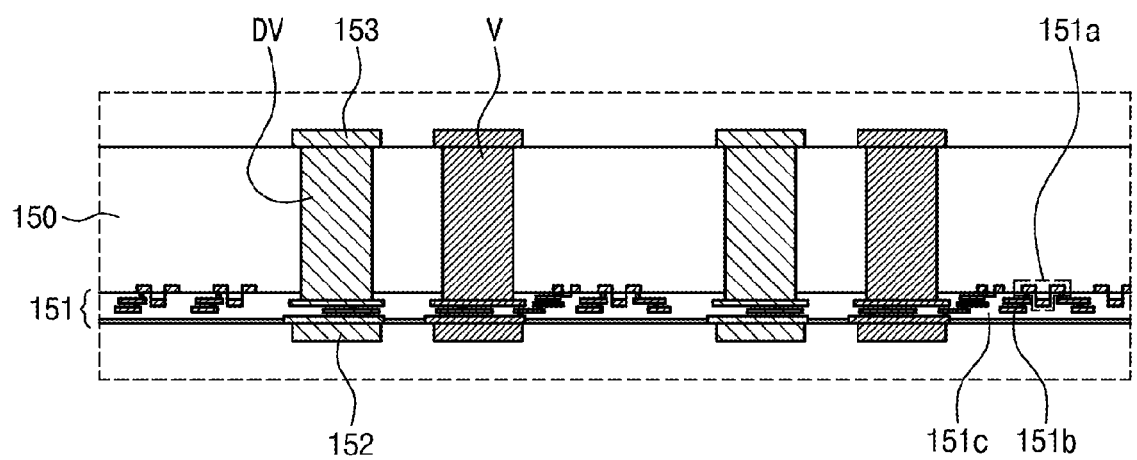
FIG. 2C is an enlarged sectional view of a region III of FIG. 2B.
Figure 3:
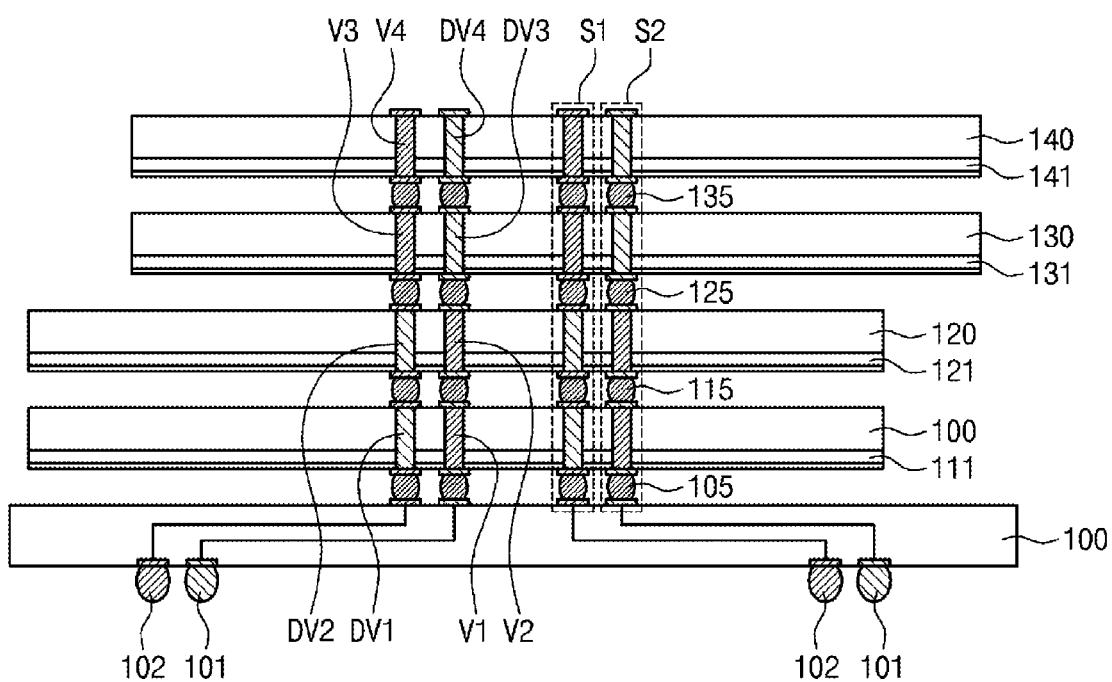

FIGS. 2A and 3 are a plan view and a sectional view illustrating a process of fabricating a semiconductor package, according to exemplary embodiments of the inventive concept. FIG. 2B is a sectional view taken along line I-II of FIG. 2A, and FIG. 2C is an enlarged sectional view of a region IV of FIG. 2B. Hereinafter, for concise description, a previously described element may be identified by a similar or identical reference number without repeating an overlapping description thereof.

Referring to FIG. 2A, a semiconductor wafer W, on which semiconductor chips 150 are integrated, may be prepared. Each of the semiconductor chips 150 may be a semiconductor chip, in which connection vias V and dummy vias DV may be formed. The semiconductor chips 150 may be fabricated to have the same structure and perform the same function; that is, they are of the same kind. In each semiconductor chip, the connection vias V and the dummy vias DV may be arranged to form at least one column each. In other words, the connection vias V may be arranged to form one or more columns, and the dummy vias DV may also be arranged to form one or more columns parallel or substantially parallel to one side of the semiconductor chip 150. The dummy vias DV may be respectively formed beside the connection vias V. The total number of the dummy vias DV may be the same as that of the connection vias V. In each semiconductor chip, the connection vias V and the dummy vias DV may be disposed to have an asymmetrical arrangement about an axis passing through a center of the semiconductor chip 150 therewith. For example, a central axis of an arrangement of the connection vias V and a central axis of an arrangement of the dummy vias DV may be closer to a side of the semiconductor chip 150 than the central axis of the semiconductor chip 150. In other words, the connection vias V and dummy vias DV may be disposed away from an axis passing through a center of the semiconductor chip 150 and parallel or substantially parallel to one side of semiconductor chip 150. However, the numbers and arrangements of the connection vias V and dummy vias DV are not limited thereto and may be variously modified.

Referring to FIGS. 2B and 2C, the semiconductor chip 150 may include a circuit pattern 151. Pads 152 may be provided on a bottom surface of the semiconductor chip 150. Here, the circuit pattern 151 may be formed adjacent to the bottom surface of the semiconductor chip 150. Redistribution pads 153 may be formed on a top surface of the semiconductor chip 150. The connection vias V, the dummy vias DV, the pads 152, and the redistribution pads 153 may be formed of or include a conductive material. The connection vias V and the dummy vias DV may be formed to have a through-silicon via (TSV) structure penetrating the semiconductor chip 150. In this case, the connection vias V and the dummy vias DV may be used as an electric path between the pads 152 and the redistribution pads 153.

Referring to FIG. 2C, the circuit pattern 151 may include integrated circuits 151a, interconnection lines 151b, and an insulating layer 151c. The integrated circuits 151a and the interconnection lines 151b may be provided in the insulating layer 151c. The integrated circuits 151a may include a memory circuit, a logic circuit, and/or any combination thereof. The connection vias V may be electrically connected to the integrated circuits 151a via the interconnection lines 151b. The dummy vias DV may be electrically disconnected from the integrated circuits 151a. Some of the redistribution pads 153 may be electrically connected to the connection vias V, and others of the redistribution pads 153 may be electrically disconnected from the dummy vias DV. Some of the pads 152 may be coupled to the connection vias V and may be electrically connected to the integrated circuits 151a of the semiconductor chip 150. Others of the pads 152 may be coupled to the dummy vias DV and may be electrically disconnected from the integrated circuits 151a of the semiconductor chip 150.

The structures of the connection vias V and the dummy vias DV are not limited to the illustrated structures and are variously modified. For example, the connection vias V and the dummy vias DV may be formed to have a via first structure, a via last structure, or a via middle structure.

Referring back to FIG. 2A, a sawing process may be performed on the semiconductor wafer W to separate the semiconductor chips 150 from each other.

Referring to FIG. 3, the first to fourth semiconductor chips 110, 120, 130, and 140 may be sequentially mounted on the substrate 100. As an example, the substrate 100 may be a printed circuit board. The first outer terminal 101 and the second outer terminal 102 may be provided on the bottom surface of the substrate 100.

The semiconductor chips 150, which are fabricated using the process described with reference to FIGS. 2A through 2C, may be sequentially stacked to form the first to fourth semiconductor chips 110, 120, 130, and 140. The first to fourth circuit patterns 111, 121, 131, and 141, the first to fourth connection vias V1, V2, V3, and V4, and the first to fourth dummy vias DV1, DV2, DV3, and DV4 may be respectively configured to have substantially the same features as the circuit pattern 151, the connection vias V, and the dummy vias DV described with reference to FIG. 2B.

One of the semiconductor chips 150, which are separated through the sawing process described with reference to FIG. 2A, may be disposed on the substrate 100 and may be used as the first semiconductor chip 110. The first connecting portions 105 may be formed between the first semiconductor chip 110 and the substrate 100, and thus, the first semiconductor chip 110 may be electrically connected to the substrate 100. The first connection vias V1 may be electrically connected to the first outer terminals 101 and the first dummy vias DV1 may be electrically connected to the second outer terminals 102.

Another of the semiconductor chips 150, which are separated through the sawing process described with reference to FIG. 2A, may be disposed on the first semiconductor chip 110 and may be used as the second semiconductor chip 120. When viewed in a plan view, the second semiconductor chip 120 may be overlapped with the first semiconductor chip 110, the second connection vias V2 may be overlapped with the first connection vias V1, and the second dummy vias DV2 may be overlapped with the first dummy vias DV1. The second connecting portions 115 may be formed between the first and second semiconductor chips 110 and 120. Some of the second connecting portions 115 may be coupled to the first and second connection vias V1 and V2 to electrically connect the first and second connection vias V1 and V2 to each other. Others of the second connecting portions 115 may be coupled to the first and second dummy vias DV1 and DV2 to electrically connect the first and second dummy vias DV1 and DV2 to each other.

A third one of the semiconductor chips 150, which are separated through the sawing process described with reference to FIG. 2A, may be rotated by 180 degrees and disposed on the second semiconductor chip 120 and may be used as the third semiconductor chip 130. The third semiconductor chip 130 may be laterally shifted from the second semiconductor chip 120 in one direction in which the connection vias is aligned with the dummy vias, and thus, when viewed in a plan view, the third connection vias V3 and the third dummy vias DV3 may be overlapped with the second dummy vias DV2 and the second connection vias V2, respectively. The third connecting portions 125 may be formed between the second and third semiconductor chips 120 and 130. Some of the third connecting portions 125 may be coupled to the second dummy vias DV2 and the third connection vias V3 to connect the second dummy vias DV2 to the third connection vias V3, respectively. Others of the third connecting portions 125 may be coupled to the second connection vias V2 and the third dummy vias DV3 to connect the second connection vias V2 to the third dummy vias DV3, respectively.

The fourth semiconductor chip 140 may be mounted on the third semiconductor chip 130. For example, as shown in FIG. 2A, a fourth one of the separated semiconductor chips 150 may be rotated by 180 degrees and be disposed on the third semiconductor chip 130. Here, the fourth semiconductor chip 140 may be laterally shifted from the second semiconductor chip 120 and may be overlapped with the third semiconductor chip 130. Accordingly, when viewed in a plan view, the fourth connection vias V4 may be overlapped with the third connection vias V3, respectively, and the fourth dummy vias DV4 may be overlapped with the third dummy vias DV3, respectively. The fourth connecting portions 135 may be formed between the third and fourth semiconductor chips 130 and 140. Some of the fourth connecting portions 135 may be coupled to the third dummy vias DV3 and the fourth dummy vias DV4 to electrically connect the third dummy vias DV3 and the fourth dummy vias DV4 to each other. Others of the fourth connecting portions 135 may be coupled to the third connection vias V3 and the fourth connection vias V4 to electrically connect the third connection vias V3 and the fourth connection vias V4 to each other.

Referring back to FIGS. 1A and 1B, the mold layer 200 may be formed on the substrate 100 to cover the first to fourth semiconductor chips 110, 120, 130, and 140. The mold layer 200 may be extended between the substrate 100 and the first semiconductor chip 110 and between the second to fourth semiconductor chips 120, 130, and 140. The mold layer 200 may include an under-fill material or an epoxy molding compound (EMC). As a result, fabrication of the semiconductor package 1 may be finished. According to example embodiments of the inventive concept, the dummy vias V may be formed in the semiconductor wafer W, as described with reference to FIG. 2A, and the semiconductor chips 150 may be obtained from the semiconductor wafer W and may be used to realize the semiconductor package 1 with the first and second connection structures S1 and S2. Accordingly, the semiconductor package 1 can be easily fabricated. The semiconductor package 1 may include the first and second connection structures S1 and S2, allowing the semiconductor chips 110, 120, 130, and 140 to be operated through multiple signal pathways or channels. Further, by stacking the third and fourth semiconductor chips 130 and 140 in a shifted manner, it is possible to use the semiconductor chips 150, in which the connection vias V and the dummy vias DV are formed to have the asymmetrical arrangement as shown in FIG. 2B, in a semiconductor package. However, example embodiments of the present disclosure are not limited to the above-described method and may be variously changed.

Figure 4B:
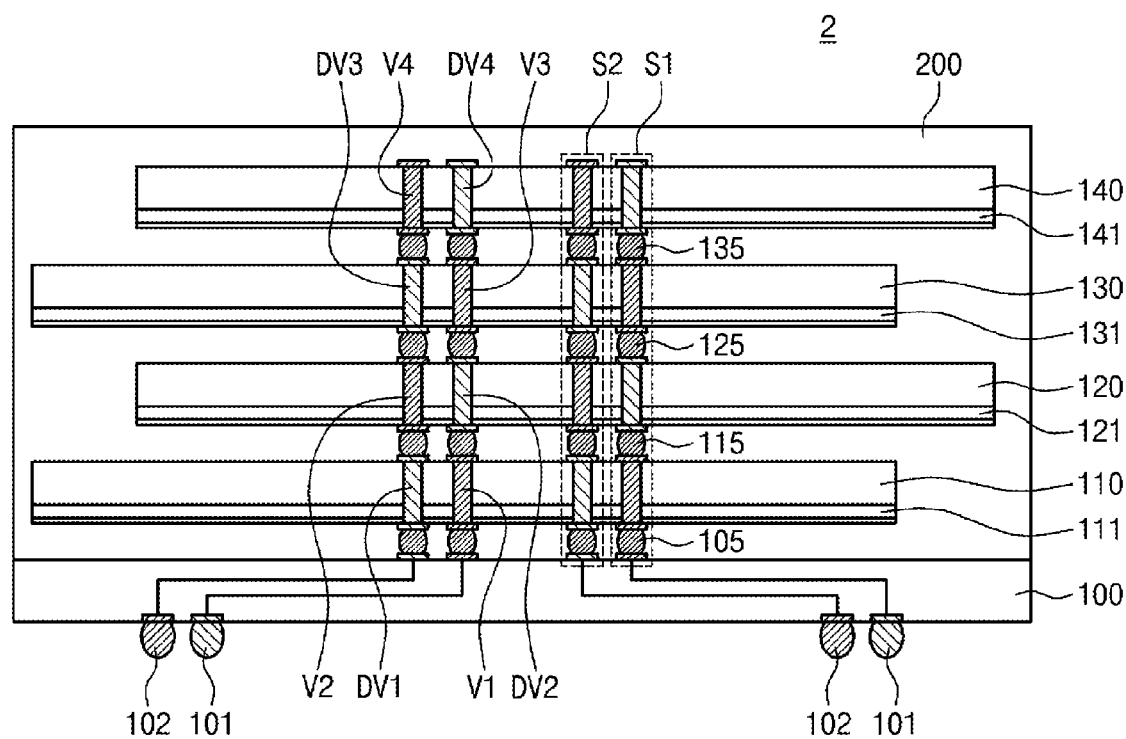
FIG. 4B is a sectional view taken along line I-II of FIG. 4A.

FIG. 4A is a plan view illustrating a semiconductor package according to other exemplary embodiments of the inventive concept. FIG. 4B is a sectional view taken along line I-II of FIG. 4A. Hereinafter, for concise description, a previously described element may be identified by a similar or identical reference number without repeating an overlapping description thereof.

Referring to FIGS. 4A and 4B, a semiconductor package 2 may include the substrate 100, a plurality of semiconductor chips 110, 120, 130, and 140 stacked on the substrate 100, a plurality of connection structures S1 and S2, and the mold layer 200. The first to fourth semiconductor chips 110, 120, 130, and 140 may be configured to have the same structure and perform the same function, but example embodiments of the inventive concepts may not be limited thereto. The substrate 100 may be a printed circuit board with a circuit pattern. The first and second outer terminals 101 and 102 may be provided on the bottom surface of the substrate 100. The mold layer 200 may be provided on the substrate 100 to cover the first to fourth semiconductor chips 110, 120, 130, and 140.

The first to fourth semiconductor chip 110, 120, 130, and 140 may be sequentially stacked on the substrate 100. The first semiconductor chip 110 may be electrically connected to the substrate 100 via the first connecting portions 105. The second connecting portions 115 may be provided between the second and third semiconductor chips 120 and 130. The third connecting portions 125 may be provided between the second and third semiconductor chips 120 and 130, and the fourth connecting portions 135 may be provided between the third and fourth semiconductor chips 130 and 140

The first to fourth semiconductor chips 110, 120, 130, and 140 may be configured to have the same features as those described with reference to FIGS. 1A through 1B. The first semiconductor chip 110 may include the first circuit pattern 111, the first connection vias V1, and the first dummy vias DV1. The second semiconductor chip 120 may include the second circuit pattern 121, the second connection vias V2, and the second dummy vias DV2. The third semiconductor chip 130 may include the third circuit pattern 131, the third connection vias V3, and the third dummy vias DV3. The fourth semiconductor chip 140 may include the fourth circuit pattern 141, the fourth connection vias V4, and the fourth dummy vias DV4. Each of the first to fourth circuit patterns 111, 121, 131, and 141 may include integrated circuits. As an example, the first to fourth circuit patterns 111, 121, 131, and 141 may be configured to have the same circuit configuration and design. The total number of the first connection vias V1, the total number of the first dummy vias DV1, the total number of the second connection vias V2, the total number of the second dummy vias DV2, the total number of the third connection vias V3, the total number of the third dummy vias DV3, the total number of the fourth connection vias V4, and the total number of the fourth dummy vias DV4 may be the same. However, the total number of the connection vias V and the dummy vias DV may be different in other embodiments.

As shown in FIG. 4B, the first to fourth semiconductor chips 110, 120, 130, and 140 may be stacked to have an alternating or zigzag stacking profile. For example, the second and fourth semiconductor chips 120 and 140 may be laterally shifted from the first and third semiconductor chips 110 and 130. When viewed in plan view, the third semiconductor chip 130 may be aligned to the first semiconductor chip 110 and the fourth semiconductor chip 140 may be aligned to the second semiconductor chip 120.

The first connection structure S1 may include the first connection vias V1, the second dummy vias DV2, the third connection vias V3, and the fourth dummy vias DV4, which are electrically connected to each other. When viewed in plan view, the first connection vias V1, the second dummy vias DV2, the third connection vias V3, and the fourth dummy vias DV4 may be overlapped with each other, as shown in FIG. 4A. Electrical signals input through the first outer terminal 101 may be transmitted to the first and third circuit patterns 111 and 131 through the first connection structure S1. Here, the second dummy vias DV2 may serve as a pathway for transmitting electric signals. The first connection structure S1 may be electrically disconnected from the second circuit pattern 121 and the fourth circuit pattern 141. As another example, the fourth dummy vias DV4 may be omitted.

The second connection structure S2 may include the first dummy vias DV1, the second connection vias V2, the third dummy vias DV3, and the fourth connection vias V4, which are electrically connected to each other. When viewed in plan view, the first dummy vias DV1, the second connection vias V2, the third dummy vias DV3, and the fourth connection vias V4 may be overlapped with each other, as shown in FIG. 4A. Electrical signals input through the second outer terminal 102 may be transmitted to the second and fourth circuit patterns 121 and 141 through the second connection structure S2. Here, each of the first and third dummy vias DV1 and DV3 may serve as a pathway for transmitting electric signals. The second connection structure S2 may be electrically disconnected from the first circuit pattern 111 and the third circuit pattern 131.

The connection structures S1 and S2 may be configured to have the same signal and voltage transmitting functions as those described with reference to FIGS. 1A through 1F. For example, electrical signals passing through the first connection structure S1 may be electrically separated from electrical signals passing through the second connection structure S2. The first connection structure S1 may be used to provide signals or voltages to the first and third semiconductor chips 110 and 130 or to apply a ground voltage to the first and third semiconductor chips 110 and 130. The second connection structure S2 may be used to provide signals or voltages to the second and fourth semiconductor chips 120 and 140 or to apply a ground voltage to the second and fourth semiconductor chips 120 and 140. A voltage supplied through the first connection structure S1 may not be delivered to the second connection structure S2, as shown in FIG. 1C, or may be delivered to the second connection structure S2, as described with reference to FIGS. 1D through 1F.

The first connection structure S1 may be used to operate the first and third semiconductor chips 110 and 130. The second connection structure S2 may be used to operate the second and fourth semiconductor chips 120 and 140. The usage of the first and second connection structures S1 and S2 may make it possible to realize multiple signal pathways or channels for operating the semiconductor chips 110, 120, 130, and 140, and thus, the semiconductor chips 110, 120, 130, and 140 can be operated with an increased operation speed.

Hereinafter, a method of fabricating a semiconductor package, according to example embodiments of the inventive concept, will be described.

Each of the first to fourth semiconductor chips 110, 120, 130, and 140 may be one of the semiconductor chips 150, which are fabricated by the process described with reference to FIGS. 2A through 2C.

The mounting of the second semiconductor chip 120 may include rotating one of the separated semiconductor chips 150 by 180 degrees, disposing the rotated semiconductor chip on the first semiconductor chip 110 in a shifted manner, and forming the second connecting portions 115. Here, as a result of the rotation and shift of the selected one of the semiconductor chips 150, the second connection vias V2 can be overlapped with the first dummy vias DV1, respectively, and the second dummy vias DV2 can be overlapped with the first connection vias V1, respectively.

When viewed in plan view, the third semiconductor chip 130 may be laterally shifted from the second semiconductor chip 120 and may be aligned to the first semiconductor chip 110. Accordingly, the third connection vias V3 and the third dummy vias DV3 may be overlapped with the second dummy vias DV2 and the second connection vias V2, respectively. The second connecting portions 115 may be formed between the second semiconductor chip 120 and the third semiconductor chip 130, and thus, the third connection vias V3 and the third dummy vias DV3 may be electrically connected to the second dummy vias DV2 and the second connection vias V2, respectively.

The mounting of the fourth semiconductor chip 140 may include rotating another of the separated semiconductor chips 150 by 180 degrees, disposing the rotated semiconductor chip on the third semiconductor chip 130 in a shifted manner, and forming the fourth connecting portions 135. The fourth semiconductor chip 140 may be laterally shifted from the third semiconductor chip 130 in such a way that it is overlapped with the second semiconductor chip 120. Accordingly, when viewed in plan view, the fourth connection vias V4 and the fourth dummy vias DV4 may be overlapped with the third dummy vias DV3 and the third connection vias V3, respectively. In FIGS. 2A and 2B, the connection vias V and the dummy vias DV may be disposed to have an asymmetrical arrangement about central axis passing through a center of each semiconductor chip (e.g., 150 of FIG. 2A). Such a shifted disposition of the second and fourth semiconductor chips 120 and 140 may make it possible to form the first and second connection structures S1 and S2. By controlling a stacking profile of the first to fourth semiconductor chips 110, 120, 130, and 140, operations of the semiconductor chips 110, 120, 130, and 140 can be controlled using the first and second connection structures S1 and S2.

Figure 5B:
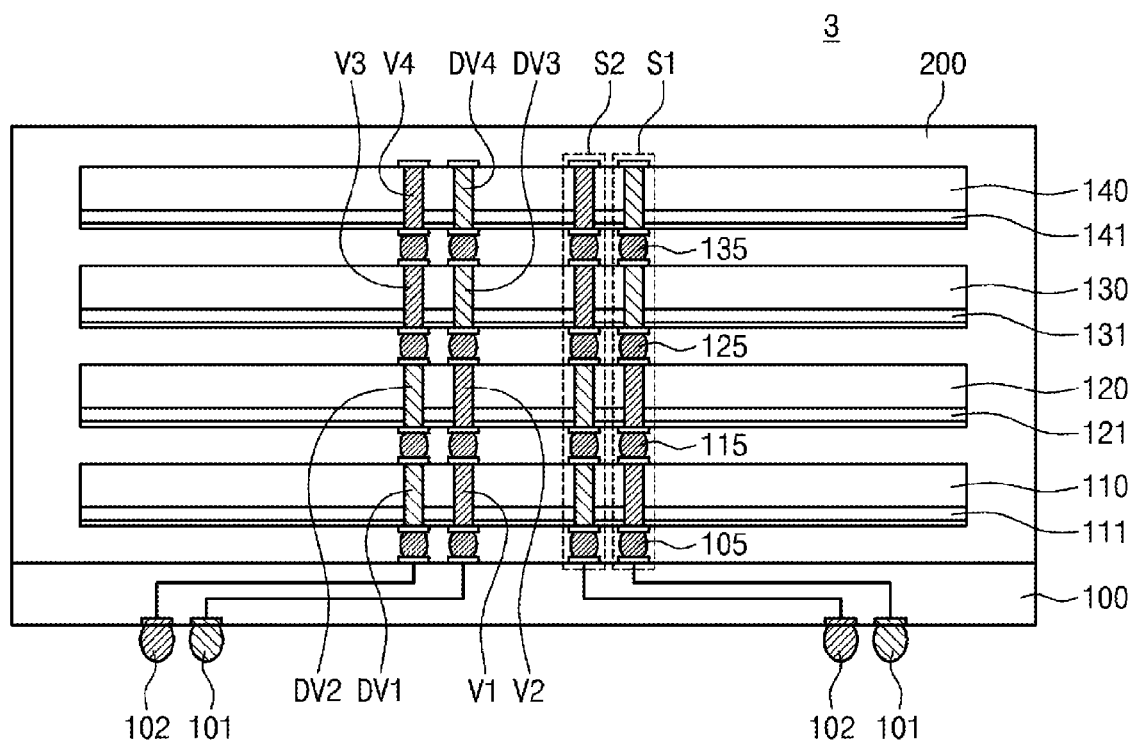
FIG. 5B is a sectional view taken along line I-II of FIG. 5A.

FIG. 5A is a plan view illustrating a semiconductor package according to still other exemplary embodiments of the inventive concept. FIG. 5B is a sectional view taken along line I-II of FIG. 5A.

Referring to FIGS. 5A and 5B, a semiconductor package 3 may include the substrate 100, the semiconductor chips 110, 120, 130, and 140 stacked on the substrate 100, the mold layer 200, and the connection structures S1 and S2. The first to fourth semiconductor chips 110, 120, 130, and 140 may be configured to have the same structure and perform the same function, but example embodiments of the inventive concepts may not be limited thereto. The connection structures S1 and S2 may be provided to penetrate the semiconductor chips 110, 120, 130, and 140 and may be electrically connected to the substrate 100. The substrate 100 may be a printed circuit board with a circuit pattern. The first and second outer terminals 101 and 102 may be provided on the bottom surface of the substrate 100.

The first to fourth semiconductor chips 110, 120, 130, and 140 may be stacked on the substrate 100. As shown in FIG. 5A, the first to fourth semiconductor chips 110, 120, 130, and 140 may be overlapped with each other, when viewed in plan view. As shown in FIG. 5B, the first to fourth semiconductor chips 110, 120, 130, and 140 may be aligned with each other.

The first semiconductor chip 110 may be electrically connected to the substrate 100 via the first connecting portions 105. The second to fourth connecting portions 115, 125, and 135 may be configured to have the same features as those described with reference to FIG. 1B.

The first semiconductor chip 110 may include the first circuit pattern 111, the first connection vias V1, and the first dummy vias DV1. The second semiconductor chip 120 may include the second circuit pattern 121, the second connection vias V2, and the second dummy vias DV2. The third semiconductor chip 130 may include the third circuit pattern 131, the third connection vias V3, and the third dummy vias DV3. The fourth semiconductor chip 140 may include the fourth circuit pattern 141, the fourth connection vias V4, and the fourth dummy vias DV4. Each of the first to fourth circuit patterns 111, 121, 131, and 141 may include the integrated circuits.

The semiconductor package 3 may be fabricated using the same method as described with reference to FIGS. 2A through 3. As described with reference to FIGS. 2A through 2C, each of the first to fourth semiconductor chips 110, 120, 130, and 140 may be one of the semiconductor chips 150, which are of the same kind and are obtained from the same semiconductor wafer W, but example embodiments of the inventive concepts may not be limited thereto. Here, the connection vias V and the dummy vias DV may be formed to have arrangement different from that shown in FIG. 2A, and in this case, the first to fourth semiconductor chips 110, 120, 130, and 140 may be stacked to have a different stacking profile. For example, when viewed in plan view, the connection vias V and the dummy vias DV may be formed to have a symmetrical arrangement or substantially symmetrical arrangement about the central axis of each semiconductor chip (e.g., 150 of FIG. 2A).

As an example, the mounting of the third and fourth semiconductor chips 130 and 140 may include rotating one of the separated semiconductor chips 150 by 180 degrees, disposing the rotated semiconductor chip on the second semiconductor chip 120, and forming the third and fourth connecting portions 125 and 135. Unlike that of FIGS. 2A and 2B, the connection vias V and the dummy vias DV may be formed to have a symmetrical arrangement or substantially symmetrical arrangement about the central axis of each semiconductor chip 150, and thus, the third and fourth semiconductor chips 130 and 140 may not be shifted from the first and second semiconductor chips 110 and 120.

The first connection structure S1 and the second connection structure S2 may be configured to have the same features as those described with reference to FIGS. 1A and 1B. For example, the first connection structure S1 may include the first connection vias V1, the second connection vias V2, the third dummy vias DV3, and the fourth dummy vias DV4, which are electrically connected to each other. The first connection structure S1 may be used to operate the first and second semiconductor chips 110 and 120. Electrical signals or voltages input through the first outer terminal 101 may be transmitted to the integrated circuits of the first and second semiconductor chips 110 and 120 through the first connection structure S1.

The second connection structure S2 may include the first dummy vias DV1, the second dummy vias DV2, the third connection vias V3, and the fourth connection vias V4, which are electrically connected to each other. The second connection structure S2 may be used to operate the third and fourth semiconductor chips 130 and 140. Electrical signals or voltages input through the second outer terminal 102 may be transmitted to the integrated circuits of the third and fourth semiconductor chips 130 and 140 through the second connection structure S2. Electrical signals transmitted to the second connection structure S2 may not be delivered to the first connection structure S1. Voltages transmitted through the second connection structure S2 may not be delivered to the first connection structure S1, as shown in FIG. 1C, or may be delivered to the first connection structure S1, as described with reference to FIGS. 1D through 1F.

As another example, the first and second connection structures S1 and S2 may be configured to have the same connection structure as that previously described with reference to FIGS. 4A and 4B. For example, the first connection structure S1 may be configured to include the first connection vias V1, the second dummy vias DV2, the third connection vias V3, and the fourth dummy vias DV4, and may be used to operate the first and third semiconductor chips 110 and 130. The second connection structure S2 may be configured to include the first dummy vias DV1, the second connection vias V2, the third dummy vias DV3, and the fourth connection vias V4, and may be used to operate the second and fourth semiconductor chips 120 and 140. Here, by adjusting arrangement of the vias V1, V2, V3, V4, DV1, DV2, DV3, and DV4, it is possible to align the first to fourth semiconductor chips 110, 120, 130, and 140 with respect to each other.

Figure 6:
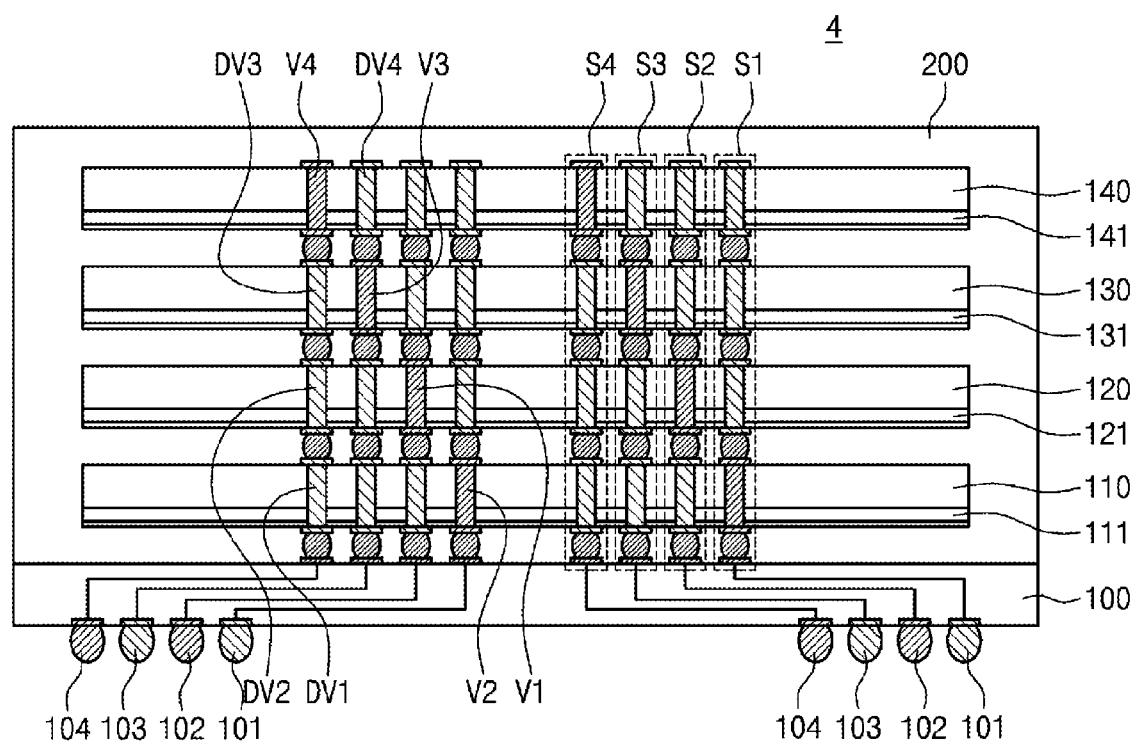
FIG. 6 is a sectional view illustrating a semiconductor package according to even other exemplary embodiments of the inventive concept.

FIG. 6 is a sectional view illustrating a semiconductor package according to even other exemplary embodiments of the inventive concept. Hereinafter, for concise description, a previously described element may be identified by a similar or identical reference number without repeating an overlapping description thereof.

Referring to FIG. 6, a semiconductor package 4 may include the substrate 100, the semiconductor chips 110, 120, 130, and 140 stacked on the substrate 100, the mold layer 200, and a plurality of connection structures S1, S2, S3, and S4. The connection structures S1, S2, S3, and S4 may penetrate the semiconductor chips 110, 120, 130, and 140 and may be electrically connected to the substrate 100. The substrate 100 may be a printed circuit board with a circuit pattern. In the present embodiments, first to fourth outer terminals 101, 102, 103, and 104 may be provided on the bottom surface of the substrate 100.

The first to fourth semiconductor chips 110, 120, 130, and 140 may be stacked in various manners. For example, when viewed in plan view, the first to fourth semiconductor chips 110, 120, 130, and 140 may be overlapped with each other, as shown in FIG. 5A, but, in certain embodiments, at least one of them may be laterally shifted from the others. As described with reference to FIGS. 2A through 2C, the first to fourth semiconductor chips 110, 120, 130, and 140 may be chips that are of the same kind and are obtained from the same semiconductor wafer. For example, the first to fourth semiconductor chips 110, 120, 130, and 140 may be configured to have the same structure and perform the same function, but example embodiments of the inventive concepts may not be limited thereto.

Each of the first to fourth semiconductor chips 110, 120, 130, and 140 may be configured to include the first to fourth circuit patterns 111, 121, 131, and 141, the first to fourth connection vias V1, V2, V3, and V4, and the first to fourth dummy vias DV1, DV2, DV3, and DV4. Each of the first to fourth circuit patterns 111, 121, 131, and 141 may be formed the integrated circuits.

The first semiconductor chip 110 may be electrically connected to the substrate 100 via the first connecting portions 105. The second to fourth connecting portions 115, 125, and 135 may be respectively provided between the first to fourth semiconductor chips 110, 120, 130, and 140, and thus, the second to fourth semiconductor chips 120, 130, and 140 may be electrically connected to each other.

The first to fourth connection structures S1, S2, S3, and S4 may be provided to penetrate the first to fourth semiconductor chips 110, 120, 130, and 140. The numbers and dispositions of the first to fourth connection vias V1, V2, V3, and V4 and the first to fourth dummy vias DV1, DV2, DV3, and DV4 may be adjusted to control the number and routing structures of the first to fourth connection structures S1, S2, S3, and S4. For example, the number of the first to fourth dummy vias DV1, DV2, DV3, and DV4 may be greater than that of the first to fourth connection vias V1, V2, V3, and V4.

The first connection structure S1 may include the first connection vias V1, and second to fourth dummy vias DV2, DV3, and DV4, which are electrically connected to each other. Electrical signals or voltages input through the first outer terminal 101 may be transmitted to the first circuit pattern 111 through the first connection structure S1. The first connection structure S1 may be used to operate the first semiconductor chip 110.

The second connection structure S2 may include the second connection vias V2, the first dummy vias DV1, the third dummy vias DV3, and the fourth dummy vias DV4, which are electrically connected to each other. The third connection structure S3 may include the third connection vias V3, the first dummy vias DV1, the second dummy vias DV2, and the fourth dummy vias DV4, which are electrically connected to each other. The fourth connection structure S4 may include the first to third dummy vias DV1, DV2, and DV3 and the fourth connection vias V4, which are electrically connected to each other. Electrical signals or voltages input through the second to fourth outer terminals 102, 103, and 104 may be transmitted to respective integrated circuits of the second to fourth semiconductor chips 120, 130, and 140 through the second to fourth to connection structures S2, S3, and S4.

Electrical signals to be transmitted through the first to fourth connection structures S1, S2, S3, and S4 may be electrically separated from each other. The first to fourth connection structures S1, S2, S3, and S4 may be configured to electrically separate voltages provided therethrough from each other, as described with reference to FIG. 1C, or they may be electrically connected to each other, as described with reference to FIGS. 1D through 1F.

By adjusting the numbers, dispositions, and electrical connection structures of the first to fourth connection vias V1, V2, V3, and V4 and the first to fourth dummy vias DV1, DV2, DV3, and DV4, it is possible to control the number of connection structures S1, S2, S3, and S4. Further, it is possible to variously control signal pathways or channels for operating the first to fourth semiconductor chips 110, 120, 130, and 140. In the present embodiment, since the first to fourth connection structures S1, S2, S3, and S4 are used to control operations of the first to fourth semiconductor chips 110, 120, 130, and 140, the semiconductor chips 110, 120, 130, and 140 can be operated with an increased operation speed. The number of the stacked semiconductor chips 110, 120, 130, and 140 may not be limited to that of the illustrated examples, and may be variously changed (e.g., to 2, 8, or 16). The number of the connection structures S1, S2, S3, and S4 may not be limited to that of the illustrated examples and may be variously modified.

It should be appreciated that the inventive concept is not limited to the illustrated example embodiment, and various embodiments are possible to operate a plurality of semiconductor chips using a plurality of connection structures including the connection vias and dummy vias. For example, a connection structure may be configured to arrange the connection via and the dummy via provided in different semiconductor chips in a specific combination to operate the selected semiconductor chips. In one example embodiment, the semiconductor package may include a first, a second, a third and a fourth semiconductor chips, each semiconductor chip including at least one connection via electrically connected to a circuit pattern of corresponding semiconductor chip and at least one dummy via electrically disconnected from the circuit pattern of corresponding semiconductor chip. The first semiconductor chip may be mounted on a substrate, and the second, the third and the fourth semiconductor chips may be stacked on the first semiconductor chip in sequence. The first connection structure may include a first connection via provided in the first semiconductor chip, a second dummy via provided in the second semiconductor chip, a third dummy via provided in the third semiconductor chip, and a four dummy via provided in the fourth semiconductor chip such that the first connection structure may be used to operate the first semiconductor chip. The second connection structure may include a first dummy via provided in the first semiconductor chip, a second connection via provided in the second semiconductor chip, a third connection via provided in the third semiconductor chip, and a four connection via provided in the fourth semiconductor chip such that the second connection structure may be used to operate the second, the third and the fourth semiconductor chips.

Figure 7A:
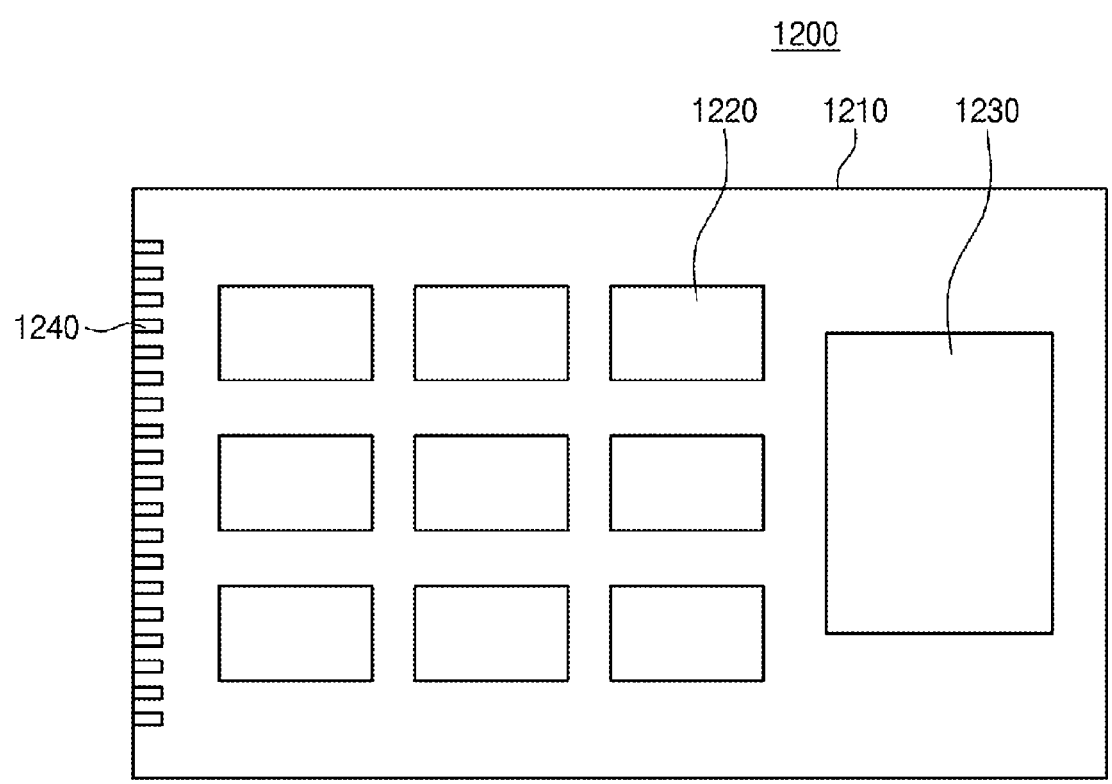
FIG. 7A is a diagram illustrating an example of package modules including a semiconductor package according to example embodiments of the inventive concept.
Figure 7B:
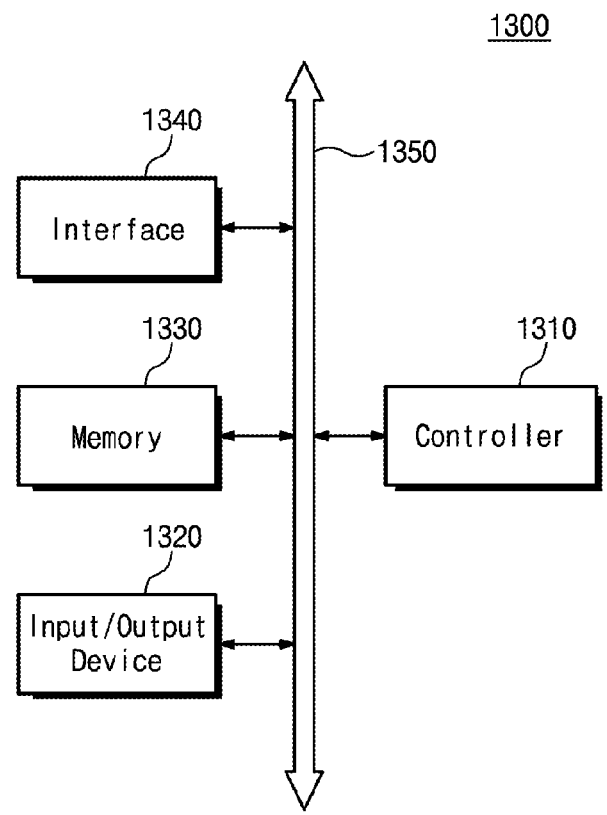
FIG. 7B is a block diagram illustrating an example of electronic systems including a semiconductor package according to example embodiments of the inventive concept.
Figure 7C:
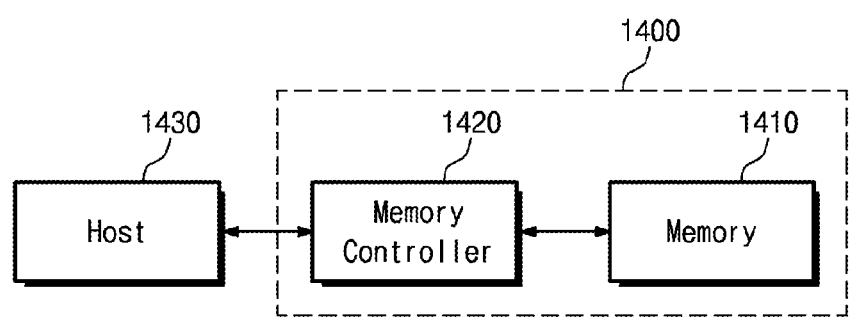
FIG. 7C is a block diagram illustrating an example of memory systems including a semiconductor package according to example embodiments of the inventive concept.

FIG. 7A is a diagram illustrating an example of package modules including a semiconductor package according to example embodiments of the present disclosure. FIG. 7B is a block diagram illustrating an example of electronic systems including a semiconductor package according to example embodiments of the present disclosure. FIG. 7C is a block diagram illustrating an example of memory systems including a semiconductor package according to example embodiments of the present disclosure.

Referring to FIG. 7A, a package module 1200 may include semiconductor devices 1220 and a semiconductor device 1230 packaged in a quad flat package (QFP) type. The semiconductor devices 1220 and 1230 may be formed using a semiconductor package technology according to example embodiments of the inventive concept, and in the package module 1200, the semiconductor devices 1220 and 1230 may be mounted on a semiconductor package 1210. The package module 1200 may be connected to an external electronic device through an external connection terminal 1240 disposed at one side of the package substrate 1210.

Referring to FIG. 7B, an electronic system 1300 may include a controller 1310, an input/output (I/O) unit 1320, and a memory device 1330. The controller 1310, the input/output (I/O) unit 1320 and the memory device 1330 may be combined with each other through a data bus 1350. The data bus 1350 may correspond to a path through which electrical signals are transmitted. The controller 1310 may include at least one of a microprocessor, a digital signal processor, a microcontroller or another logic device. The other logic device may have a similar function to any one of the microprocessor, the digital signal processor and the microcontroller. The controller 1310 and the memory device 1330 may include one of the semiconductor packages 1 and 2 according to example embodiments of the present disclosure. The I/O unit 1320 may include a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 which transmits electrical data to a communication network or receives electrical data from a communication network. The interface unit 1340 may operate by wireless or cable. For example, the interface unit 1340 may include an antenna for wireless communication or a transceiver for cable communication. Although not shown in the drawings, an application chipset, a camera image processor (CIS), and/or an input/output unit may further be provided in the electronic system 1300.

The electronic system 1300 may be realized as a mobile system, a personal computer, an industrial computer, or a logic system performing various functions. For example, the mobile system may be one of a personal digital assistant (PDA), a portable computer, a web tablet, a wireless phone, a mobile phone, a laptop computer, a digital music system, and an information transmit/receive system. When the electronic system 1300 performs wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Referring to FIG. 7C, a memory system 1400 may include a non-volatile memory device 1410 and a memory controller 1420. The non-volatile memory device 1410 and the memory controller 1420 may store data or read stored data. The non-volatile memory device 1410 may include at least one of the semiconductor packages 1 and 2 according to example embodiments of the present disclosure. The memory controller 1420 may control the non-volatile memory device 1410 in order to read the stored data and/or to store data in response to read/write request of a host 1430.

According to example embodiments of the inventive concept, a plurality of connection structures may be provided to penetrate a plurality of semiconductor chips. The connection structures may be used to operate semiconductor chips in an independent manner. The usage of the connection structures makes it possible to realize various operation modes of and an increased operation speed in the semiconductor chips.

Each of the semiconductor chips may include connection vias and dummy vias. By adjusting the numbers, dispositions, and electrical connection structures of connection and dummy vias, it is possible to control the number of the connection structures. This makes it possible to control connection pathways for operating the semiconductor chips.

While exemplary embodiments of the inventive concepts have been particularly shown and described, it will be understood by one of ordinary skill in the art that variations in form and detail may be made therein without departing from the spirit and scope of the attached claims.

What is claimed is:
1. A semiconductor package, comprising:
a substrate;
a first semiconductor chip mounted on the substrate and provided with a first circuit pattern;
a second semiconductor chip disposed on the first semiconductor chip and provided with a second circuit pattern;
a first connection structure penetrating the first semiconductor chip and the second semiconductor chip; and
a second connection structure disposed beside the first connection structure to penetrate the first semiconductor chip and the second semiconductor chip,
wherein the first semiconductor chip has the same structure as the second semiconductor chip,
wherein the second semiconductor chip is laterally shifted from the first semiconductor chip in a first direction, wherein the first connection structure is electrically connected to the first circuit pattern and is electrically disconnected from the second circuit pattern,
wherein the second connection structure is electrically disconnected from the first circuit pattern and is electrically connected to the second circuit pattern,
wherein the first connection structure comprises:
  a first connection via provided through the first semiconductor chip and electrically connected to the first circuit pattern; and
  a second dummy via provided through the second semiconductor chip and electrically disconnected from the second circuit pattern,
wherein the second dummy via is electrically connected to the first connection via,
wherein the first connection via is overlapped with the second dummy via to form a first column,
wherein the second connection structure comprises:
  a first dummy via provided through the first semiconductor chip and electrically disconnected from the first circuit pattern; and
  a second connection via provided through the second semiconductor chip electrically connected to the second circuit pattern,
wherein the first dummy via is electrically connected to the second connection via, and
wherein the second connection via is overlapped with the first dummy via to form a second column parallel to the first column.

2. The semiconductor package of claim 1,
wherein the first connection structure further comprises:
a first connection terminal provided between the first semiconductor chip and the second semiconductor chip and coupled to the first connection via and the second dummy via.

3. The semiconductor package of claim 2,
wherein the second connection structure further comprises:
a second connection terminal provided between the first semiconductor chip and the second semiconductor chip and coupled to the first dummy via and the second connection via.

4. The semiconductor package of claim 1, further comprising a third semiconductor chip mounted on the second semiconductor chip and provided with a third circuit pattern,
wherein the first connection structure is electrically connected to the third circuit pattern, and
wherein the second connection structure is electrically disconnected from the third circuit pattern.

5. The semiconductor package of claim 1, further comprising a third semiconductor chip mounted on the second semiconductor chip and provided with a third circuit pattern,
wherein the first connection structure is electrically disconnected from the third circuit pattern, and
wherein the second connection structure is electrically connected to the third circuit pattern.

6. The semiconductor package of claim 1,
wherein the second circuit pattern comprises an integrated circuit that is of the same kind as an integrated circuit of the first circuit pattern.

7. A semiconductor package, comprising:
a substrate;
a first semiconductor chip mounted on the substrate and provided with a plurality of first connection vias arrayed in a first direction and a plurality of first dummy vias arrayed in the first direction;
a second semiconductor chip mounted on the first semiconductor chip and provided with a plurality of second connection vias arrayed in the first direction and a plurality of second dummy vias arrayed in the first direction;
a plurality of first connection terminals each interposed between the first semiconductor chip and the second semiconductor chip and coupled to one of the plurality of first connection vias and one of the plurality of second dummy vias; and
a plurality of second connection terminals each interposed between the first semiconductor chip and the second semiconductor chip and coupled to one of the plurality of first dummy vias and one of the plurality of second connection vias,
wherein:
  the second semiconductor chip has a 2-fold rotational symmetry with respect to the first semiconductor chip such that in a first orientation, the plurality of first connection vias each vertically overlaps with one of the plurality of second connection vias and in a second orientation with the second semiconductor chip rotated relative to the first semiconductor chip, the plurality of first connection vias each vertically overlaps with one of the plurality of second dummy vias,
  the first semiconductor chip has the same structure as the second semiconductor chip, and
  the second semiconductor chip is laterally shifted from the first semiconductor chip in the first direction.

8. The semiconductor package of claim 7,
wherein, when viewed in plan view, the plurality of second connection vias each is overlapped with one of the plurality of first dummy vias, and
wherein the plurality of second dummy vias each is overlapped with one of the plurality of first connection vias.

9. The semiconductor package of claim 7,
wherein a number of the plurality of first connection vias is the same as a number of the plurality of first dummy vias.

10. The semiconductor package of claim 7,
wherein a number of the plurality of second connection vias is the same as a number of the plurality of second dummy vias.

11. The semiconductor package of claim 7,
wherein the first semiconductor chip comprises a first circuit pattern, and
wherein the first circuit pattern is electrically connected to the plurality of first connection vias and is electrically disconnected from the plurality of first dummy vias.

12. The semiconductor package of claim 7,
wherein the second semiconductor chip comprises a second circuit pattern, and
wherein the second circuit pattern is electrically connected to the plurality of second connection vias and is electrically disconnected from the plurality of second dummy vias.

13. A semiconductor package, comprising:
a substrate;
a first semiconductor chip mounted on the substrate and provided with a first circuit pattern;
a second semiconductor chip provided on the first semiconductor chip and provided with a second circuit pattern;
a first dummy via, a first connection via, a second dummy via and a second connection via in the listed sequence arranged in a first direction, the first connection via and the second connection via and the first dummy via and the second dummy via provided through the first semiconductor chip;

a third connection via, a third dummy via, a fourth connection via and a fourth dummy via in the listed sequence arranged in the first direction, the third connection via and the fourth connection via and the third dummy via and the fourth dummy via provided through the second semiconductor chip, wherein:

the first connection via and the second connection via are electrically connected to the first circuit pattern and the first dummy via and the second dummy via are electrically disconnected from the first circuit pattern, the third connection via and the fourth connection via are electrically connected to the second circuit pattern and the third dummy via and the fourth dummy via are electrically disconnected from the second circuit pattern, the first semiconductor chip has the same structure as the second semiconductor chip, the second semiconductor chip is laterally shifted from the first semiconductor chip in the first direction, and the first dummy via, the first connection via, the second dummy via and the second connection via are overlapped with and electrically connected to the third connection via, the third dummy via, the fourth connection via and the fourth dummy via, respectively.

14. The semiconductor package of claim 13, further comprising:

a connection terminal interposed between the first semiconductor chip and the second semiconductor chip and coupled to the first dummy via and the second connection via.

15. The semiconductor package of claim 13, wherein:

the first dummy via and the third connection via constitute a first connection structure electrically connected to the second circuit pattern and is electrically disconnected from the first circuit pattern, the first connection via and the third dummy via constitute a second connection structure electrically connected to the first circuit pattern and is electrically disconnected from the second circuit pattern, the second dummy via and the fourth connection via constitute a third connection structure electrically connected to the second circuit pattern and is electrically disconnected from the first circuit pattern, the second connection via and the fourth dummy via constitute a fourth connection structure electrically connected to the first circuit pattern and is electrically disconnected from the second circuit pattern, the first connection structure comprises a plurality of first connection structures arranged in a second direction crossing the first direction to form a first column, the second connection structure comprises a plurality of second connection structures arranged in the second direction to form a second column, the third connection structure comprises a plurality of third connection structures arranged in the second direction to form a third column, the fourth connection structure comprises a plurality of fourth connection structures arranged in the second direction to form a fourth column, and the first to fourth columns are substantially parallel to each other and arranged in the first direction.

* * * * *